US012771096B2

(12) United States Patent
Tokuda

(10) Patent No.: US 12,771,096 B2
(45) Date of Patent: Oct. 20, 2026

(54) SURFACE EMITTING LASER, SURFACE EMITTING LASER ARRAY, AND ELECTRONIC DEVICE

(71) Applicant: SONY SEMICONDUCTOR SOLUTIONS CORPORATION, Kanagawa (JP)

(72) Inventor: Kota Tokuda, Kanagawa (JP)

(73) Assignee: Sony Semiconductor Solutions Corporation, Kanagawa (JP)

( * ) Notice: Subject to any disclaimer, the term of this patent is extended or adjusted under 35 U.S.C. 154(b) by 535 days.

(21) Appl. No.: 18/284,361

(22) PCT Filed: Feb. 4, 2022

(86) PCT No.: PCT/JP2022/004344
§ 371 (c)(1),
(2) Date: Sep. 27, 2023

(87) PCT Pub. No.: WO2022/239330
PCT Pub. Date: Nov. 17, 2022

(65) Prior Publication Data

US 2024/0072514 A1 Feb. 29, 2024

(30) Foreign Application Priority Data

May 10, 2021 (JP) ................................ 2021-079514

(51) Int. Cl.
*H01S 5/183* (2006.01)
*H01S 5/30* (2006.01)
(Continued)

(52) U.S. Cl.
CPC ........ *H01S 5/18397* (2013.01); *H01S 5/3095* (2013.01); *H01S 5/34353* (2013.01); *H01S 5/426* (2013.01)

(58) Field of Classification Search
CPC ..... H01S 5/3095; H01S 5/18397; H01S 5/426
See application file for complete search history.

(56) References Cited

U.S. PATENT DOCUMENTS 5,212,706 A 5/1993 Jain
6,546,038 B1 4/2003 Mizuno
(Continued)

FOREIGN PATENT DOCUMENTS

CN 111641109 A 9/2020
JP 2000-299493 A 10/2000
(Continued)

OTHER PUBLICATIONS

Garcia J Ch et al: "Epitaxially Stacked Lasers With Esaki Junctions: a Bipolar Cascade Laser", Applied Physics Letters, American Institute of Physics, Dec. 29, 1997 (Dec. 29, 1997), pp. 3752-3754, vol. 71, No. 26, 2 Huntington Quadrangle, Melville, NY 11747, XP000735177.

(Continued)

*Primary Examiner* — James A Menefee
(74) *Attorney, Agent, or Firm* — K&L Gates LLP

(57) ABSTRACT

The present technology provides a surface emitting laser capable of stabilizing emission characteristics against change in driving temperature.

The present technology provides a surface emitting laser including: first and second multilayer film reflectors; a plurality of active regions stacked between the first and second multilayer film reflectors; and a tunnel junction disposed between at least one set of two adjacent active regions, in which the plurality of active regions includes at least two of the active regions in which peak wavelengths of emission spectra are different from each other. According to (Continued)

the present technology, a surface emitting laser capable of stabilizing emission characteristics against change in driving temperature is provided.

19 Claims, 26 Drawing Sheets

(51) Int. Cl.
*H01S 5/343* (2006.01)
*H01S 5/42* (2006.01)

(56) References Cited

U.S. PATENT DOCUMENTS

| | | | | |
|---|---|---|---|---|
| 2001/0043629 | A1 | 11/2001 | Sun | |
| 2002/0131458 | A1 | 9/2002 | Sirbu et al. | |
| 2002/0131464 | A1 | 9/2002 | Sirbu et al. | |
| 2003/0162315 | A1 | 8/2003 | Kapon et al. | |
| 2003/0169786 | A1 | 9/2003 | Kapon et al. | |
| 2004/0066816 | A1 | 4/2004 | Collins et al. | |
| 2004/0076209 | A1 | 4/2004 | Bour et al. | |
| 2004/0179566 | A1 * | 9/2004 | El-Bahar | B82Y 20/00 372/45.01 |
| 2008/0197289 | A1 | 8/2008 | Muller | |
| 2020/0335942 | A1 | 10/2020 | Carson | |
| 2020/0403379 | A1 | 12/2020 | Huang et al. | |
| 2021/0091537 | A1 | 3/2021 | Huang et al. | |

FOREIGN PATENT DOCUMENTS

| | | | |
|---|---|---|---|
| JP | 2002-134835 | A | 5/2002 |
| JP | 2004-128502 | A | 4/2004 |
| JP | 2004-146833 | A | 5/2004 |
| JP | 2008-180719 | A | 8/2008 |
| JP | 2012-256635 | A | 12/2012 |
| WO | WO 02/075868 | A2 | 9/2002 |

OTHER PUBLICATIONS

International Search Report issued in International Patent Application No. PCT/JP2022/004344 on Apr. 19, 2022 and English translation of same. 7 pages.

Written Opinion issued in International Patent Application No. PCT/JP2022/004344 on Apr. 19, 2022. 6 pages.

* cited by examiner

A

B

A

B

A

B

SURFACE EMITTING LASER, SURFACE EMITTING LASER ARRAY, AND ELECTRONIC DEVICE

TECHNICAL FIELD

The technology according to the present disclosure (hereinafter also referred to as "the present technology") relates to a surface emitting laser, a surface emitting laser array, and an electronic device.

BACKGROUND ART

Conventionally, a surface emitting element in which a plurality of active regions is stacked is known (see, for example, Patent Document 1).

CITATION LIST

Patent Document

Patent Document 1: Japanese Patent Application Laid-Open No. 2000-299493

SUMMARY OF THE INVENTION

Problems to be Solved by the Invention

However, in the conventional surface emitting element, there is room for improvement in stabilizing the light emission characteristics with respect to the change in the driving temperature.

Therefore, a main object of the present technology is to provide a surface emitting laser capable of stabilizing emission characteristics against change in driving temperature.

Solutions to Problems

The present technology provides a surface emitting laser including:

first and second multilayer film reflectors;

a plurality of active regions stacked between the first and second multilayer film reflectors; and a tunnel junction disposed between at least one set of two adjacent active regions, in which the plurality of active regions includes at least two of the active regions in which peak wavelengths of emission spectra of the active layer are different from each other.

Each of the plurality of active regions may include at least one active layer, and the at least two active regions may be different from each other in at least one of a composition of the active layer, a thickness of the active layer, and the number of the active layers.

A peak wavelength of the emission spectrum may be shorter as the at least two active regions are closer to an emission surface of the surface emitting laser.

A composition of an element having the largest lattice constant among elements included in the active layer may be smaller as the at least two active regions are closer to an emission surface of the surface emitting laser.

A thickness of the active layer may be smaller as the at least two active regions are closer to an emission surface of the surface emitting laser.

The number of the active layers may be larger as the at least two active regions are closer to an emission surface of the surface emitting laser.

The at least two active regions may include at least one set of two adjacent active regions, and a difference between peak wavelengths of emission spectra of the at least one set of two adjacent active regions may be 5 nm or more and 50 nm or less.

The at least two active regions may include at least one set of two adjacent active regions, and a difference between peak wavelengths of emission spectra of the at least one set of two adjacent active regions may be 15 nm or more and 30 nm or less.

A difference between peak wavelengths in an active region in which an emission spectrum has a longest peak wavelength and an active region in which an emission spectrum has a shortest peak wavelength among the at least two active regions may be 30 nm or more and 60 nm or less.

The plurality of active regions may be at least three active regions, and at least two sets of two of the active regions adjacent to each other may be different in a difference between peak wavelengths of emission spectra in the two of the active regions adjacent to each other.

The plurality of active regions may be at least three active regions, and at least two sets of two of the active regions adjacent to each other may be the same in a difference between peak wavelengths of emission spectra in the two of the active regions adjacent to each other.

The at least one active layer may include $In_xGa_{(1-x)}As$ ($0 \le x \le 1.0$).

Each of the plurality of active regions may include a semiconductor layer including $Al_yGa_{(1-y)}As$ ($0 \le y \le 1.0$).

The tunnel junction may be disposed at least between the active region farthest from an emission surface of the surface emitting laser among the plurality of active regions and the active region adjacent to the active region.

The tunnel junction may be disposed between all two adjacent active regions.

The tunnel junction may not be disposed at least between the active region closest to an emission surface of the surface emitting laser and the active region adjacent to the active region.

In each of at least two sets of two adjacent active regions, the tunnel junction may be disposed between the two adjacent active regions, and the plurality of tunnel junctions may have a higher impurity doping concentration as being farther from an emission surface of the surface emitting laser.

The present technology provides a surface emitting laser array including a plurality of the surface emitting lasers.

The present technology also provides an electronic device including the surface emitting laser.

The present technology also provides an electronic device including the surface emitting laser array.

MODE FOR CARRYING OUT THE INVENTION

Figure 1:
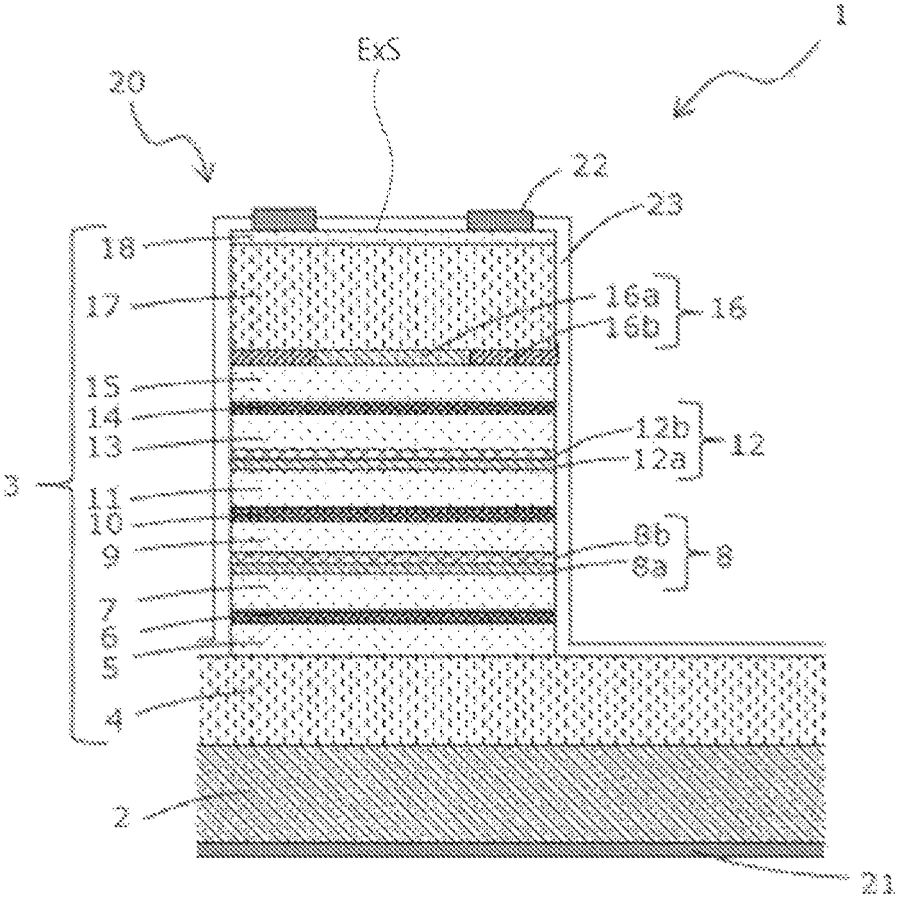
FIG. 1 is a cross-sectional view of a surface emitting laser according to a first embodiment of the present technology.

Hereinafter, preferred embodiments of the present technology will be described in detail with reference to the accompanying drawings. Note that in the description and the drawings, components having substantially the same function and configuration are denoted by the same reference numerals, and redundant descriptions are omitted. The embodiments described below provide representative embodiments of the present technology, and the scope of the present technology is not to be narrowly interpreted according to these embodiments. In the present specification, even in a case where it is described that a method for manufacturing a surface emitting laser, a surface emitting laser array, and an electronic device according to the present technology exhibit a plurality of effects, it is sufficient if the surface emitting laser, the surface emitting laser array, and the electronic device according to the present technology exhibit at least one effect. The effects described herein are merely examples and are not limited, and other effects may be provided.

Furthermore, the description will be given in the following order.

1. Introduction
2. Surface emitting laser according to first embodiment of present technology
   (1) Configuration of surface emitting laser
   (2) Operation of surface emitting laser
   (3) Method for manufacturing surface emitting laser
   (4) Effects of surface emitting laser
3. Surface emitting laser according to second embodiment of present technology
4. Surface emitting laser according to modification of second embodiment of present technology
5. Surface emitting laser according to third embodiment of present technology
6. Modification of present technology
7. Application example to electronic device
8. Example in which surface emitting laser is applied to distance measuring device
9. Example in which distance measuring device is mounted on mobile body

1. Introduction

Semiconductor lasers are applied to various applications by taking advantage of features such as small size and long life. Among semiconductor lasers, particularly surface emitting lasers have advantages of ultra-miniaturization and high-speed operation, and are actively applied to optical communication, light source applications of distance measuring sensors, and the like.

Meanwhile, in the surface emitting laser, the temperature dependence of the oscillation wavelength and the temperature dependence of the emission spectrum in the active region are different, and the difference between the oscillation wavelength and the peak wavelength of the emission spectrum greatly changes and the gain greatly changes, due to the change in the driving temperature, so that the emission characteristics (laser characteristics) are not stable, which is disadvantageous.

In order to overcome this disadvantage, Patent Document 1 discloses a surface emitting element including a light emitting layer including quantum wells having peak wavelengths of emission spectra sequentially different from each other.

However, in Patent Document 1, the carrier density injected into the light emitting layer varies depending on the position of the light emitting layer, and the gain in the light emitting layer having the highest carrier density becomes dominant, so that it is difficult to sufficiently suppress the change in the gain with respect to the driving temperature in each light emitting layer. That is, in the surface emitting element described in Patent Document 1, there is room for improvement in stabilizing the light emission characteristics with respect to the change in the driving temperature.

Therefore, as a result of intensive studies, the inventor has developed the surface emitting laser of the present technology as a surface emitting laser capable of stably controlling the shape of the emission spectrum in each active layer (each light emitting layer) and, consequently, stabilizing the emission characteristics with respect to the change in driving temperature.

2. Surface Emitting Laser According to First Embodiment of Present Technology (1) Configuration of Surface Emitting Laser

[Overall Configuration]

FIG. 1 is a cross-sectional view of a surface emitting laser 1 according to the first embodiment of the present technology. Hereinafter, for the sake of convenience, the upper side in the cross-sectional view of FIG. 1 and the like will be described as an upper side, and the lower side in the cross-sectional view of FIG. 1 and the like will be described as a lower side.

As an example, as illustrated in FIG. 1, the surface emitting laser 1 has a stacked structure 3 provided on a substrate 2.

As an example, the stacked structure 3 includes first and second multilayer film reflectors 4 and 17, first to third active regions 6, 10, and 14, and first and second tunnel junctions 8 and 12.

The first and second multilayer film reflectors 4 and 17 are arranged in this order from the substrate 2 side.

The first to third active regions 6, 10, and 14 are disposed between the first and second multilayer film reflectors 4 and 17 in this order from the first multilayer film reflector 4 side.

The first tunnel junction 8 is disposed between the first and second active regions 6 and 10. The second tunnel junction 12 is disposed between the second and third active regions 10 and 14.

A first n-side spacer layer 5 is disposed between the first multilayer film reflector 4 and the first active region 6.

A first p-side spacer layer 7 is disposed between the first active region 6 and the first tunnel junction 8.

A second n-side spacer layer 9 is disposed between the first tunnel junction 8 and the second active region 10.

A second p-side spacer layer 11 is disposed between the second active region 10 and the second tunnel junction 12.

A third n-side spacer layer 13 is disposed between the second tunnel junction 12 and the third active region 14.

Between the third active region 14 and the second multilayer film reflector 17, a third p-side spacer layer 15 and an oxide confinement layer 16 are disposed in this order from the third active region 14 side.

A contact layer 18 is disposed on the second multilayer film reflector 17.

In the stacked structure 3, as an example, a portion of the first multilayer film reflector 4 excluding a portion (lower portion) is a mesa portion 20 protruding in a direction perpendicular to the substrate 2.

The mesa portion 20 and its peripheral portion are covered with an insulating film 23. The insulating film 23 has an opening on the top side of the mesa portion 20, and an anode electrode 22 (p-side electrode) having a circling shape (for example, a ring shape) is provided in the opening to be in contact with the contact layer 18. An inner peripheral side of the anode electrode 22 serves as an emission port of the surface emitting laser 1, and an exposed upper surface of the mesa portion 20 (for example, an exposed upper surface of the contact layer 18) serves as an emission surface ExS.

A cathode electrode 21 (n-side electrode) of, for example, a solid shape is provided on the back surface (lower surface) of the substrate 2.

[Substrate]

The substrate 2 is, as an example, a conductive substrate, and for example, a semiconductor substrate (for example, an n-GaAs substrate) doped with silicon (Si) of $3.0\times10^{18}$ $cm^{-3}$ as an impurity.

[First Multilayer Film Reflector]

The first multilayer film reflector 4 is, for example, a semiconductor multilayer film reflector. The multilayer film reflector is also referred to as a distributed Bragg reflector. A semiconductor multilayer film reflector which is a type of multilayer film reflector (distributed Bragg reflector) has low light absorption, high reflectance, and conductivity.

More specifically, as an example, the first multilayer film reflector 4 is a semiconductor multilayer film reflector of a first conductivity type (for example, n-type), and has a structure in which semiconductor layers of a plurality of types (for example, two types) having different refractive indexes (for example, low refractive index layers and high refractive index layers) are alternately stacked with an optical thickness of a ¼ wavelength of an oscillation wavelength. The low refractive index layers of the first multilayer film reflector 4 include, for example, $Al_{x41}Ga_{1-x41}As$ ($0<x41<1$). The high refractive index layers of the first multilayer film reflector 4 include, for example, $Al_{x42}Ga_{1-x42}As$ ($0\leq x42<x41$).

[First n-Side Spacer Layer]

The first n-side spacer layer 5 includes, for example, $Al_{x5}Ga_{1-x5}As$ ($0\leq x5<1$) of the first conductivity type (for example, n-type).

[First Active Region]

The first active region 6 has, for example, a multiple quantum well structure in which well layers (quantum well layers) as active layers including undoped $In_{x6w}Ga_{1-x6w}As$ ($0<x6w<1$) and barrier layers including undoped $Al_{x6b}Ga_{1-x6b}As$ ($0<x6b<1$) are alternately stacked.

[First p-Side Spacer Layer]

The first p-side spacer layer 7 includes $Al_{x7}Ga_{1-x7}As$ ($0\leq x7<1$) of the second conductivity type (for example, p-type).

[First Tunnel Junction]

As an example, the first tunnel junction 8 includes a first high-concentration p-type layer 8*a* and a first high-concentration n-type layer 8*b*. The first high-concentration n-type layer 8*b* is disposed on the upper side (anode electrode 22 side) of the first high-concentration p-type layer 8*a*. More specifically, the first high-concentration p-type layer 8*a* is doped with p-type impurity such as carbon (C) of $1.0\times10^{20}$ $cm^{-3}$, and has a film thickness of 10 nm, for example. More specifically, the first high-concentration n-type layer 8*b* is doped with n-type impurity such as silicon (Si) of $5.0\times10^{19}$ $cm^{-3}$, and has a film thickness of 10 nm, for example.

[Second n-Side Spacer Layer]

As an example, the second n-side spacer layer 9 includes $Al_{x9}Ga_{1-x9}As$ ($0\leq x9<1$) of the first conductivity type (for example, n-type).

[Second Active Region]

The second active region 10 has, for example, a multiple quantum well structure in which well layers (quantum well layers) as active layers including undoped $In_{x10w}Ga_{1-x10w}As$ ($0 \leq x10w \leq 1$) and barrier layers including undoped $Al_{x10b}Ga_{1-x10b}As$ ($0 \leq x10b < 1$) are alternately stacked.

[Second p-Side Spacer Layer]

As an example, the second p-side spacer layer 11 includes $Al_{x11}Ga_{1-x11}As$ ($0 \leq x11 < 1$) of the second conductivity type (for example, p-type).

[Second Tunnel Junction]

The second tunnel junction 12 includes a second high-concentration p-type layer 12*a* and a second high-concentration n-type layer 12*b*. The second high-concentration n-type layer 12*b* is disposed on the upper side (anode electrode 22 side) of the second high-concentration p-type layer 12*a*. More specifically, the second high-concentration p-type layer 12*a* is doped with p-type impurity such as carbon (C) of $1.0 \times 10^{20}$ $cm^{-3}$, and has a film thickness of 10 nm, for example. More specifically, the second high-concentration n-type layer 12*b* is doped with n-type impurity such as silicon (Si) of $5.0 \times 10^{19}$ $cm^{-3}$, and has a film thickness of 10 nm, for example. That is, the first and second tunnel junctions 8 and 12 are substantially the same.

[Third n-Side Spacer Layer]

As an example, the third n-side spacer layer 13 includes $Al_{x13}Ga_{1-x13}As$ ($0 \leq x13 < 1$) of the first conductivity type (for example, n-type).

[Third Active Region]

The third active region 14 has, for example, a multiple quantum well structure in which well layers (quantum well layers) as active layers including undoped $In_{x14w}Ga_{1-x14w}As$ ($0 \leq x14w \leq 1$) and barrier layers including undoped $Al_{x14b}Ga_{1-x14b}As$ ($0 \leq x14b < 1$) are alternately stacked.

[Third p-Side Spacer Layer]

The third p-side spacer layer 15 includes $Al_{x15}Ga_{1-x15}As$ ($0 \leq x15 < 1$) of the second conductivity type (for example, p-type).

[Oxide Confinement Layer]

The oxide confinement layer 16 is also referred to as a current confinement layer, and includes a current injection region 16*a* and a current confinement region 16*b*. The current confinement region 16*b* is formed around the current injection region 16*a*. The current injection region 16*a* includes $Al_{x16}Ga_{1-x16}As$ ($0 < x16 \leq 1$) of the second conductivity type (for example, p-type). The current confinement region 16*b* includes, for example, $Al_2O_3$ (aluminum oxide), and is obtained by, for example, substituting oxygen for As in a selectively oxidized layer including $Al_{x16}Ga_{1-x16}As$ ($0 < x16 \leq 1$), and oxidizing Al from the side surface. The aluminum oxide thus formed has an insulating property, and therefore the oxide confinement layer 16 has a function of confining current.

[Second Multilayer Film Reflector]

The second multilayer film reflector 17 is, for example, a semiconductor multilayer film reflector. The multilayer film reflector is also referred to as a distributed Bragg reflector. A semiconductor multilayer film reflector which is a type of multilayer film reflector (distributed Bragg reflector) has low light absorption, high reflectance, and conductivity.

More specifically, as an example, the second multilayer film reflector 17 is a semiconductor multilayer film reflector of a second conductivity type (for example, p-type), and has a structure in which semiconductor layers of a plurality of types (for example, two types) having different refractive indexes (for example, low refractive index layers and high refractive index layers) are alternately stacked with an optical thickness of a ¼ wavelength of an oscillation wavelength. The low refractive index layer of the second multilayer film reflector 17 includes, for example, $Al_{x171}Ga_{1-x171}As$ ($0 < x171 < 1$). The high refractive index layer of the first multilayer film reflector 4 includes, for example, $Al_{x172}Ga_{1-x172}As$ ($0 \leq x172 < x171$).

[Contact Layer]

The contact layer 18 is a layer for bringing the second multilayer film reflector 17 and the anode electrode 22 into ohmic contact with each other. As an example, the contact layer 18 includes $Al_{x18}Ga_{1-x18}As$ ($0 \leq x18 < 1$) of the second conductivity type (for example, p-type).

[Anode Electrode]

As an example, the anode electrode 22 includes an alloy, and has a structure in which, for example, AuGe, Ni, and Au stacked in this order from the contact layer 18 side.

[Cathode Electrode]

As an example, the cathode electrode 21 includes a non-alloy, and has a structure in which, for example, Ti, Pt, and Au are stacked in this order from the substrate 2 side.

Here, in order to obtain desired laser characteristics (emission characteristics) in the surface emitting laser, the oscillation wavelength needs to be within a wavelength range enabling a high gain of the emission spectrum.

Meanwhile, the active region including a well layer has a property that a peak wavelength of an emission spectrum thereof changes depending on a driving temperature (use temperature). The active region including a well layer also has a property that an oscillation wavelength changes depending on the driving temperature. Since the temperature dependence of the emission spectrum and the temperature dependence of the oscillation wavelength are different, even if the oscillation wavelength falls within the above-described wavelength range at a certain driving temperature (for example, a driving temperature at an initial driving stage), there is a concern that the oscillation wavelength may become out of the wavelength range due to change in the driving temperature.

Figure 2:
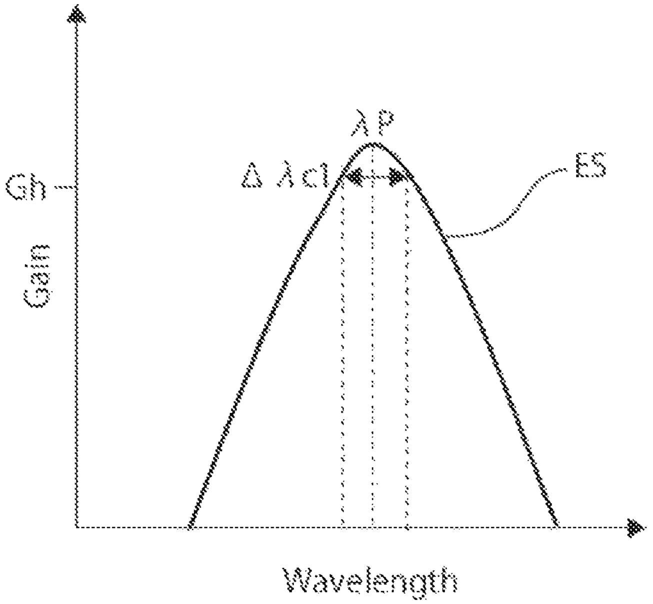
FIG. 2 is a diagram illustrating an emission spectrum in an active region of a surface emitting laser of Comparative Example 1.

FIG. 2 is a diagram illustrating an emission spectrum of a surface emitting laser of Comparative Example 1.

The surface emitting laser of Comparative Example 1 has a configuration similar to the surface emitting laser 1 of the first embodiment except that the surface emitting laser has a single active region and does not have a tunnel junction.

In the surface emitting laser of Comparative Example 1, as illustrated in FIG. 2, a wavelength range $\Delta\lambda c\mathbf{1}$ enabling a high gain Gh in the emission spectrum ES is narrow. Therefore, the oscillation wavelength is likely to become out of the wavelength range $\Delta\lambda c\mathbf{1}$ due to change in the driving temperature. That is, in the surface emitting laser of Comparative Example 1, a driving temperature range enabling desired laser characteristics is narrow.

Figure 3:
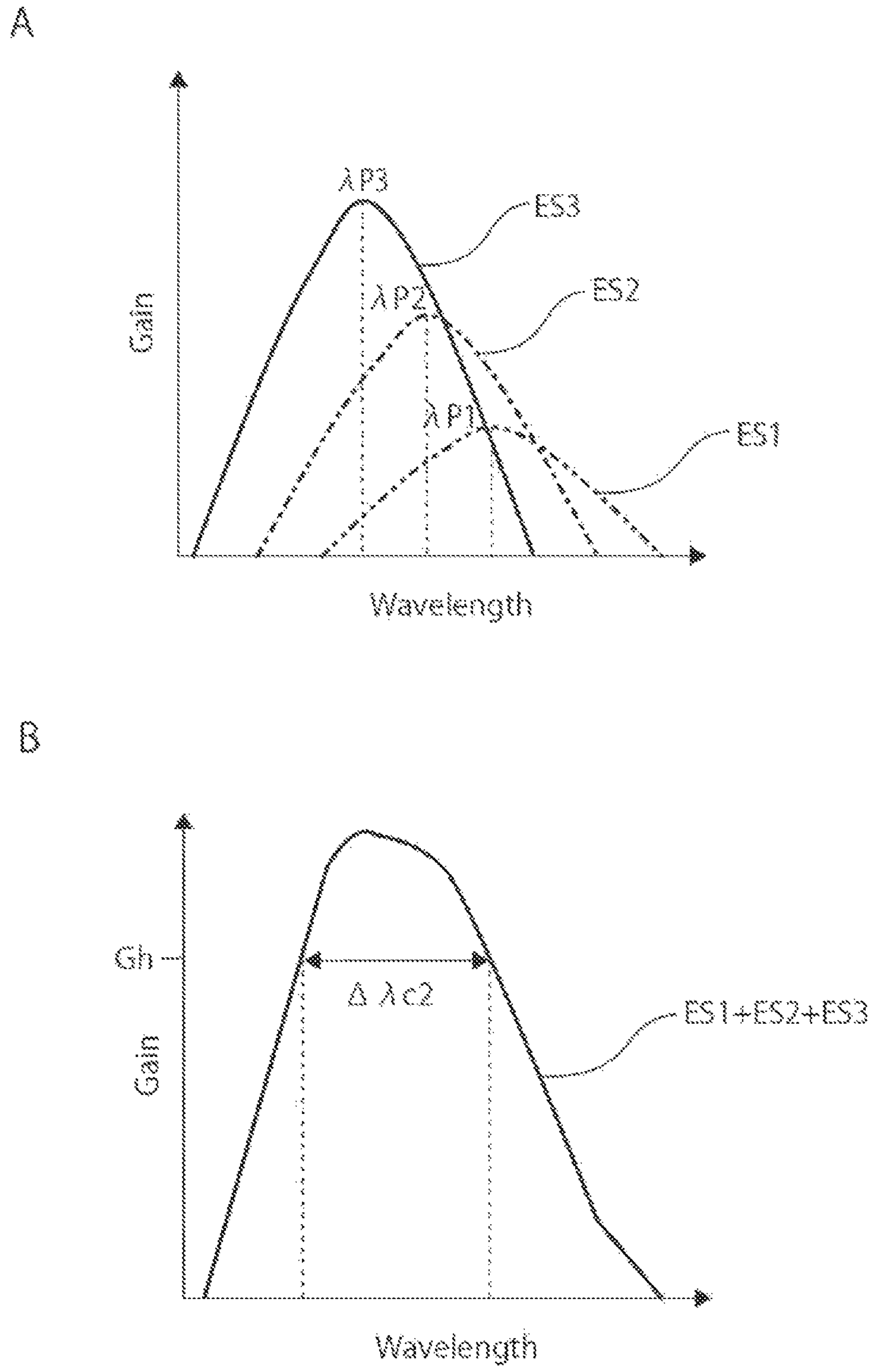
FIG. 3A is a graph indicating emission spectrum in each active region of a surface emitting laser of Comparative Example 2.
FIG. 3B is a diagram illustrating a waveform obtained by superimposing emission spectra in FIG. 3A.

FIG. 3A is a diagram illustrating emission spectra of a surface emitting laser of Comparative Example 2. FIG. 3B is a diagram illustrating a waveform obtained by superimposing emission spectra of a surface emitting laser of Comparative Example 2.

The surface emitting laser of Comparative Example 2 has a configuration similar to the surface emitting laser 1 of the first embodiment except that it does not have a tunnel junction. As illustrated in FIG. 3A, the surface emitting laser of Comparative Example 2 is designed so that peak wavelengths λP1 to λP3 of emission spectra ES1 to ES3 in the first to third active regions are shifted from each other.

Since the surface emitting laser of Comparative Example 2 does not have a tunnel junction, current of the same current value cannot be injected into the first to third active regions. Specifically, the current injected into the second active region located on the downstream side of the third active region in the current path is significantly smaller than the current injected into the third active region on the most upstream side in the current path, and the current injected into the first active region located on the downstream side of the second active region in the current path is significantly smaller than the current injected into the third active region.

Therefore, the waveform of the emission spectrum ES2 in the second active region is significantly smaller than the waveform of the emission spectrum ES3 in the third active region, and the waveform of the emission spectrum ES1 in the first active region is significantly smaller than the waveform of the emission spectrum ES2 in the second active region. More specifically, the gain at the peak wavelength λP2 of the emission spectrum ES2 in the second active region greatly decreases comparing to the gain at the peak wavelength λP3 of the emission spectrum ES3 in the third active region, and the gain at the peak wavelength λP1 of the emission spectrum ES1 in the first active region greatly decreases comparing to the gain at the peak wavelength λP2.

As a result, although the wavelength range Δλc2 (see FIG. 3B) enabling the high gain Gh of the waveform (see FIG. 3B) obtained by superimposing the emission spectra ES1 to ES3 (see FIG. 3A) in the first to third active regions is wider than the wavelength range Δλc1 (see FIG. 2) in Comparative Example 1, the oscillation wavelength may be out of Δλc2 when the change in the driving temperature becomes large. That is, in the surface emitting laser of Comparative Example 2, there is room for improvement in widening the driving temperature range in which desired laser characteristics are obtained.

Therefore, as will be described in detail below, the inventor has devised to widen the driving temperature range in which desired laser characteristics are obtained in the surface emitting laser 1.

Figure 4:
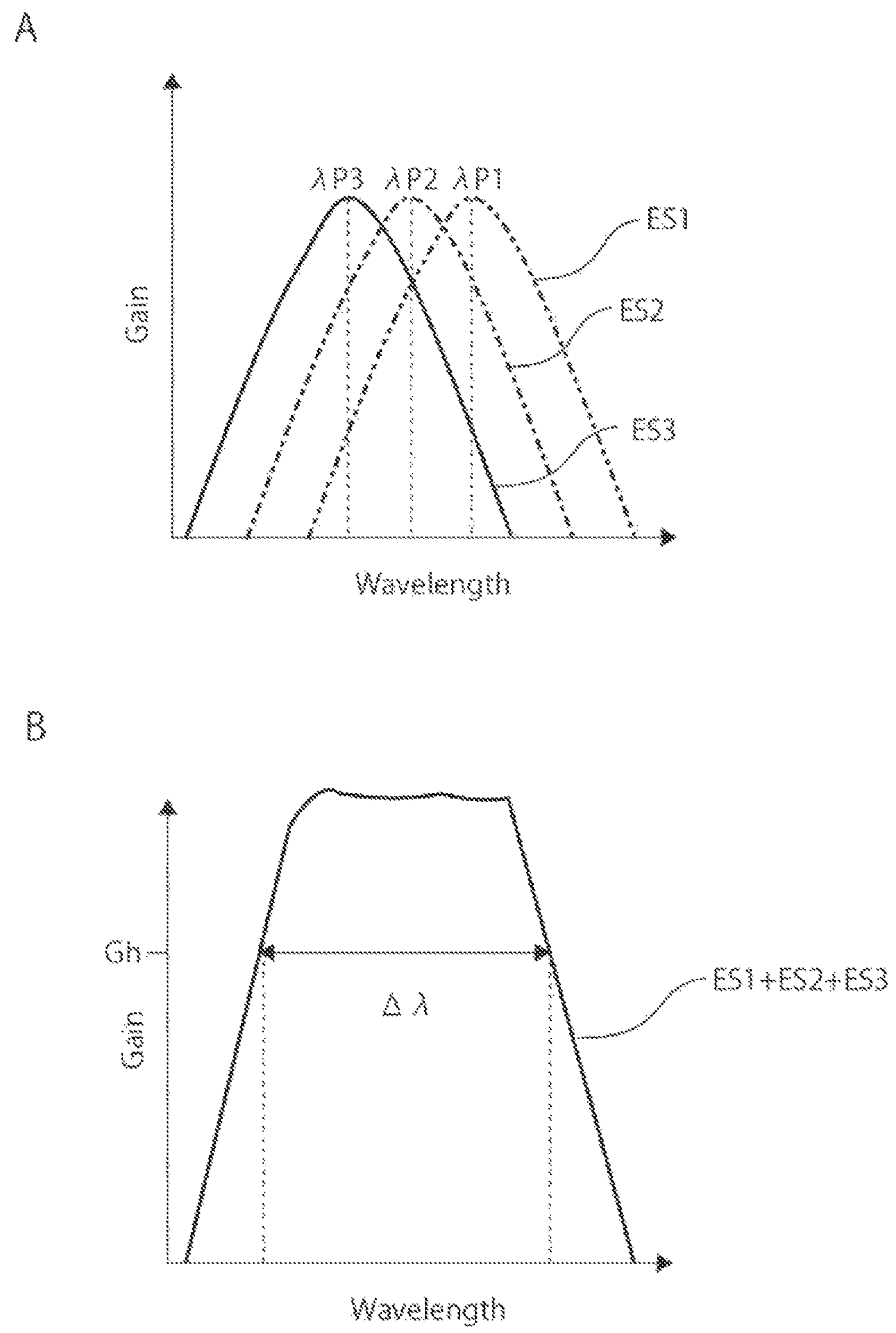
FIG. 4A is a diagram illustrating a first example of an emission spectrum in each active region of the surface emitting laser in FIG. 1.
FIG. 4B is a diagram illustrating a waveform obtained by superimposing emission spectra in FIG. 4A.

In the surface emitting laser 1, the peak wavelengths of the emission spectra in first to third active regions 6, 10, and 14 are different from each other as illustrated in FIG. 4A as an example. Specifically, in the first to third active regions 6, 10, and 14, the peak wavelength of the emission spectrum is shorter as the region is closer to the emission surface ExS of the surface emitting laser 1.

That is, the relational expression: λP3<λP2<λP1 holds between the peak wavelength λP1 of the emission spectrum ES1 in the first active region 6 farthest from the emission surface ExS of the surface emitting laser 1, the peak wavelength λP3 in the third active region 14 closest to the emission surface ExS, and the peak wavelength λP2 of the emission spectrum ES2 in the second active region 10 disposed between the first and third active regions 6 and 14.

Moreover, in the surface emitting laser 1, a tunnel junction 8 is disposed between the first and second active regions 6 and 10 and a tunnel junction 12 is disposed between the second and third active regions 10 and 14. Thus, current of the same current value can flow through the first to third active regions 6, 10, and 14, and the waveforms of the emission spectra of the respective active regions are substantially the same (substantially the same shape and substantially the same size). That is, the gain substantially the same as the gain at the peak wavelength λP3 of the emission spectrum ES3 in the third active region 6 can be obtained at the peak wavelength λP2 of the emission spectrum ES2 in the second active region 10 and the peak wavelength λP1 of the emission spectrum ES1 in the first active region.

Therefore, the wavelength range Δλ (see FIG. 4B) enabling the high gain Gh of the waveform (see FIG. 4B) obtained by superimposing the emission spectra ES1 to ES3 (see FIG. 4A) in the first to third active regions 6, 10, and 14 can be sufficiently wider than the wavelength range Δλc2 (see FIG. 3B) in Comparative Example 2, and thus the possibility that the oscillation wavelength becomes out of Δλ can be suppressed even when the change in the driving temperature becomes large. That is, in the surface emitting laser 1 of the first embodiment, it is possible to widen the driving temperature range in which desired laser characteristics are obtained while reducing the light absorption loss. The above description "while reducing the light absorption loss" will be supplemented below. The surface emitting laser has a higher light intensity at a position closer to the emission surface. Furthermore, each active layer in the active regions has a property of more strongly absorbing light having a shorter wavelength. Therefore, the peak wavelength of the emission spectrum is further shortened as the active region is closer to the emission surface where the light intensity is higher. As a result, light absorption in each active region can be suppressed, and a decrease in laser light intensity can be suppressed.

Here, in order to satisfy the above-described relational expression λP3<λP2<λP1, for example, as a first method, the In composition, which is the element having the largest lattice constant among the elements included in the well layer as the active layer including $In_xGa_{1-x}As$ ($0 \le x \le 1.0$), may be smaller as a region among the first to third active regions 6, 10, and 14 is closer to the emission surface ExS of the surface emitting laser 1. That is, the relational expression of $x14w \le x10w < x6w$ may be satisfied for the In compositions x6w, x10w, and x14w of the first to third active regions 6, 10, and 14.

In order to satisfy the above-described relational expression λP3<λP2<λP1, as a second method, for example, a region closer to the emission surface ExS of the surface emitting laser 1 among the first to third active regions 6, 10, and 14 may have a smaller thickness of the well layer as the active layer.

In order to satisfy the above-described relational expression λP3<λP2<λP1, as a third method, for example, a region closer to the emission surface ExS of the surface emitting laser 1 among the first to third active regions 6, 10, and 14 may have a greater number of the well layers as the active layer.

In order to satisfy the above-described relational expression λP3<λP2<λP1, at least two of the first to third methods may be adopted together.

For example, in order to obtain a suitable waveform as illustrated in FIG. 4B, a difference between peak wavelengths of emission spectra of two adjacent active regions (for example, the difference λP1−λP2 between the peak wavelengths of the emission spectra ES1 and ES2 in the first and second active regions 6 and 10 and the difference λP2−λP3 between the peak wavelengths of the emission spectra ES2 and ES3 in the second and third active regions 10 and 14) is preferably 5 nm or more and 50 nm or less, and more preferably 15 nm or more and 30 nm or less.

In this case, in order to obtain a more suitable waveform, the difference λP1−λP3 between the peak wavelengths of the first active region 6 where the peak wavelength of the emission spectrum is the longest and the third active region 14 where the peak wavelength is the shortest among the first to third active regions 6, 10, and 14 is preferably 30 nm or more and 60 nm or less.

In the example of FIG. 4A, the difference λP1−λP2 between the peak wavelengths of the emission spectra ES1 and ES2 of the first and second active regions 6 and 10 that are adjacent to each other is the same as the difference λP2−λP3 between the peak wavelengths of the emission spectra ES2 and ES3 of the second and third active regions 10 and 14 that are adjacent to each other.

Figure 5:
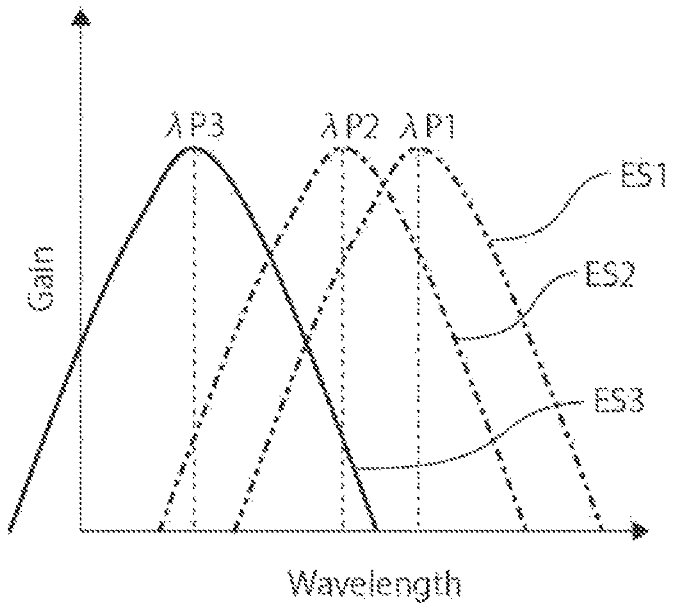
FIG. 5A is a diagram illustrating a second example of an emission spectrum in each active region of the surface emitting laser in FIG. 1.
FIG. 5B is a diagram illustrating a waveform obtained by superimposing emission spectra in FIG. 5A.
Figure 5:
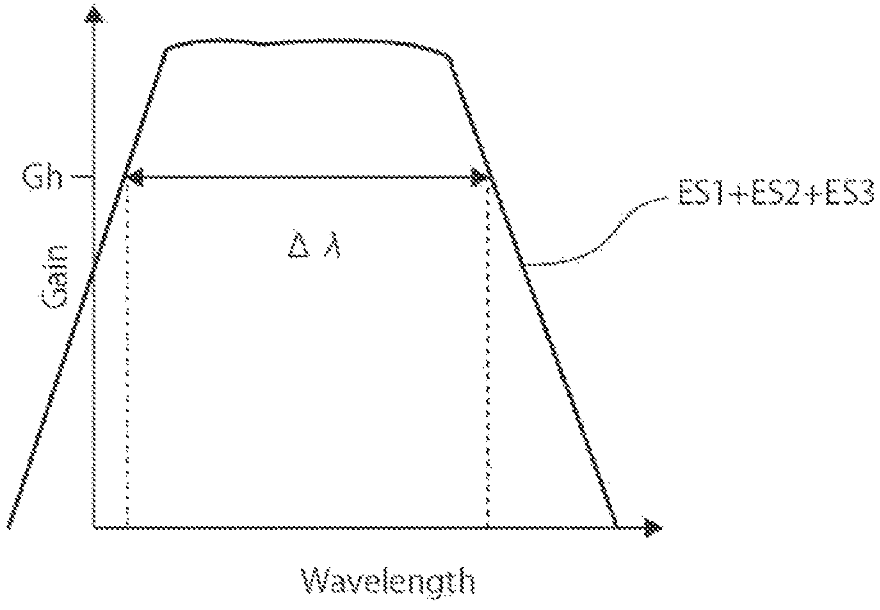

Note that as illustrated in FIG. 5A, the difference λP1−λP2 between the peak wavelengths of the emission spectra in the first and second active regions 6 and 10 that are adjacent to each other may be different from the difference λP2−λP3 between the peak wavelengths of the emission spectra in the second and third active regions 10 and 14 that are adjacent to each other.

More specifically, in the example of FIG. 5A, λP3 is shifted to the short wavelength side from the example of FIG. 4A, and λP2−λP3>λP1−λP2 is satisfied.

As illustrated in FIG. 5B, the waveform and Δλ when the emission spectra ES1 to ES3 of FIG. 5A are superimposed are shifted to the short wavelength side from the example of FIG. 4B. In this case, the possibility that the oscillation wavelength becomes out of Δλ can be suppressed even when the driving temperature changes to a higher temperature side.

Figure 6:
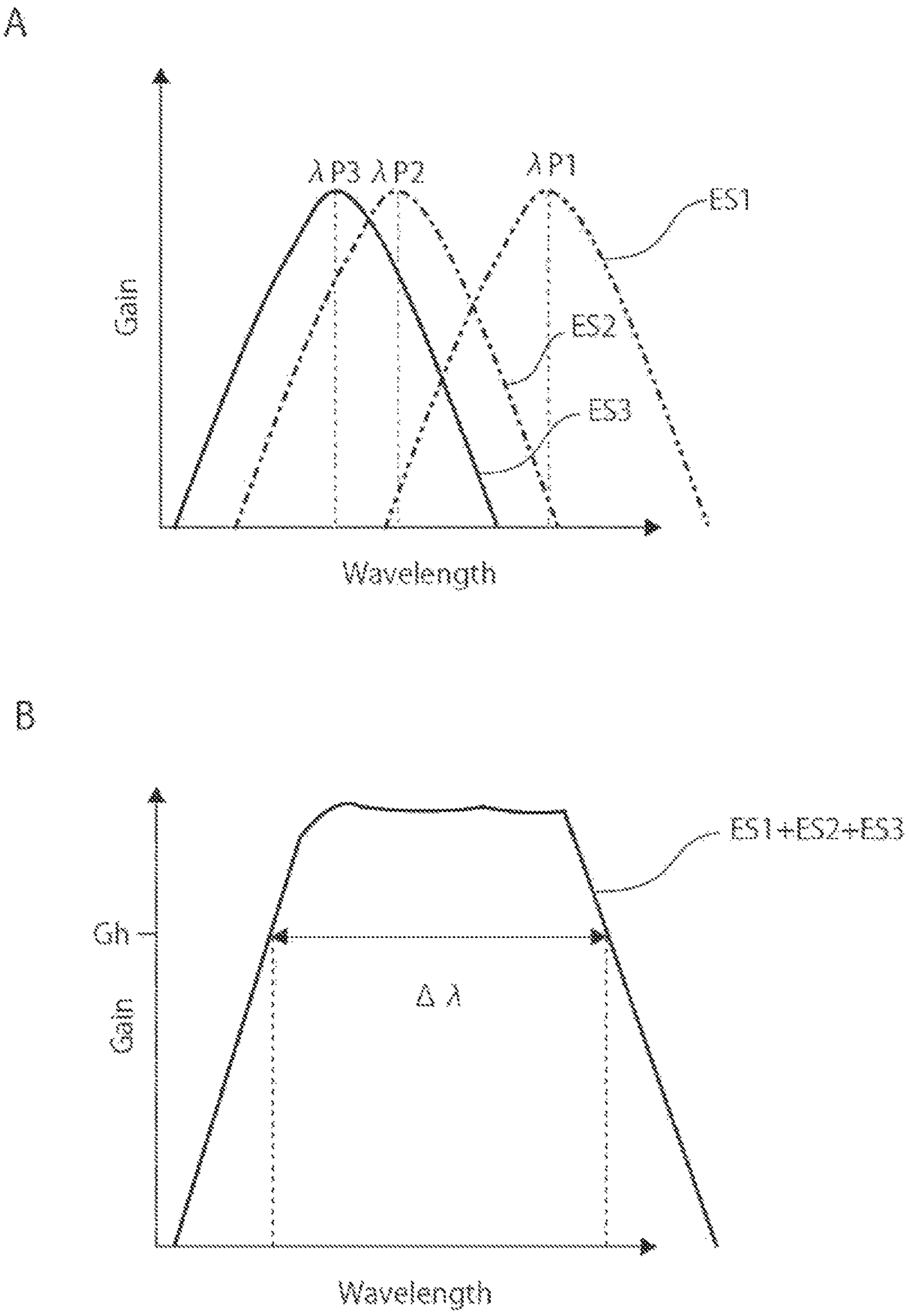
FIG. 6A is a diagram illustrating a third example of an emission spectrum in each active region of the surface emitting laser in FIG. 1.
FIG. 6B is a diagram illustrating a waveform obtained by superimposing emission spectra in FIG. 6A.

Furthermore, as illustrated in FIG. 6A, the difference λP1−λP2 between the peak wavelengths of the emission spectra ES1 and ES2 in the first and second active regions 6 and 10 that are adjacent to each other may be different from the difference λP2−λP3 between the peak wavelengths of the emission spectra ES2 and ES3 of the second and third active regions 10 and 14 that are adjacent to each other.

More specifically, in the example of FIG. 6A, λP1 is shifted to the long wavelength side from the example of FIG. 4A, and λP2−λP3<λP1−λP2 is satisfied.

As illustrated in FIG. 6B, the waveform and Δλ when the emission spectra ES1 to ES3 of FIG. 6A are superimposed are shifted to the long wavelength side from the example of FIG. 4B. In this case, the possibility that the oscillation wavelength becomes out of Δλ can be suppressed even when the driving temperature changes to a lower temperature side.

(2) Operation of Surface Emitting Laser

In the surface emitting laser 1 illustrated in FIG. 1, if a voltage is applied between the anode electrode 22 and the cathode electrode 21 and a current flows from the anode electrode 22 into the stacked structure 3, the current is confined by the oxide confinement layer 16 and injected into the third active region 14, a current having substantially the same current value as the injected current is injected into the second active region 10 due to a tunnel effect by the second tunnel junction 12, and a current having substantially the same current value as the injected current is injected into the first active region 6 due to a tunnel effect by the first tunnel junction 8.

Accordingly, when the first to third active regions 6, 8, and 10 emit light with substantially the same emission intensity, and the light from each region reciprocates while being amplified by the corresponding active region between the first and second multilayer film reflectors 4 and 17 to satisfy the oscillation conditions, the light is emitted as laser light from the top of the mesa portion 20.

(3) Method for Manufacturing Surface Emitting Laser

Figure 7:
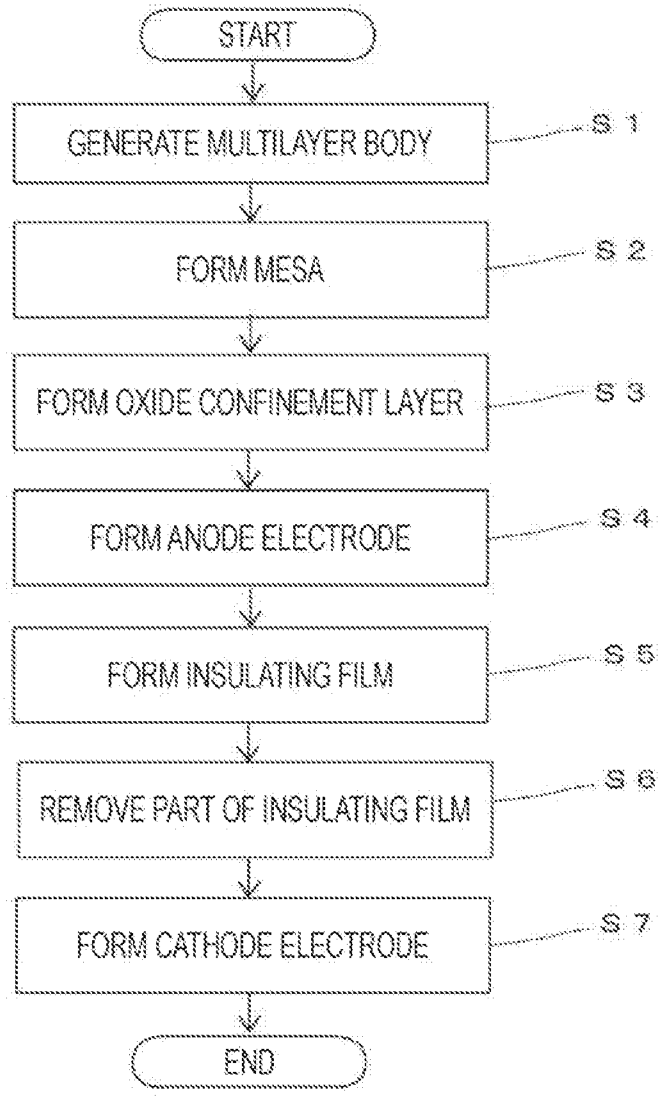
FIG. 7 is a flowchart for describing a method for manufacturing the surface emitting laser according to the first embodiment of the present technology.

Hereinafter, a method for manufacturing the surface emitting laser 1 will be described with reference to the flowchart (steps S1 to S7) in FIG. 7 and the cross-sectional views of FIGS. 8 to 16. Here, as an example, a plurality of the surface emitting lasers 1 is generated at a time using a substrate 32 (wafer, see FIG. 8) that is a base material of the substrate 2 by a semiconductor manufacturing method using a semiconductor manufacturing device. Next, a plurality of surface emitting lasers that are integrated to be one piece is separated by dicing to obtain a plurality of chip-shaped surface emitting lasers.

In the first step S1, a multilayer body is generated. Here, as an example, a compound semiconductor is stacked on the substrate 32 by an epitaxial crystal growth method such as, for example, a chemical vapor deposition (CVD) method, for example, a metal organic chemical vapor deposition (MOCVD) method to form a stack.

Figure 8:
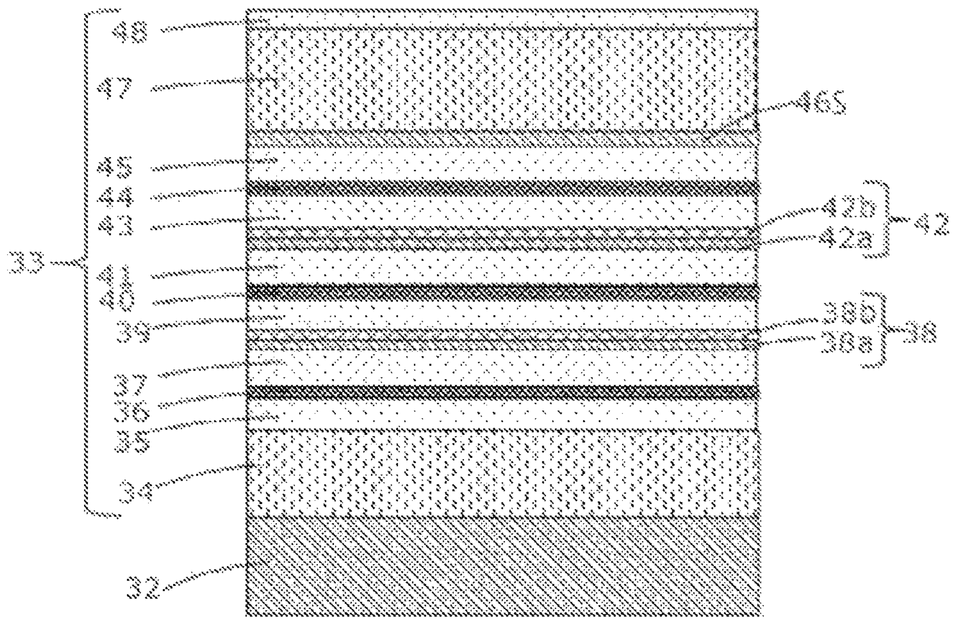
FIG. 8 is a cross-sectional view illustrating a first step in FIG. 7.

Specifically, a first multilayer film reflector 34, a first n-side spacer layer 35, a first active region 36, a first p-side spacer layer 37, a first tunnel junction 38, a second n-side spacer layer 39, a second active region 40, a second p-side spacer layer 41, a second tunnel junction 42, a third n-side spacer layer 43, a third active region 44, a third p-side spacer layer 45, a selectively oxidized layer 46S including $Al_{x16}Ga_{1-x16}As$ ($0 \le x16 \le 1$), a second multilayer film reflector 47, and a contact layer 48 are stacked in this order on the substrate 32 (see FIG. 8).

At this time, as raw materials of the compound semiconductor, for example, a methyl-based organometallic gas such as trimethylaluminum (TMAl), trimethylgallium (TMGa), or trimethylindium (TMIn) and an arsine ($AsH_3$) gas are used, as a raw material of donor impurities, for example, disilane ($Si_2H_6$) is used, and as a raw material of acceptor impurities, for example, carbon tetrabromide ($CBr_4$) is used.

In the next step S2, a mesa is formed. Specifically, the stack is etched to form a mesa portion 50.

Figure 9:
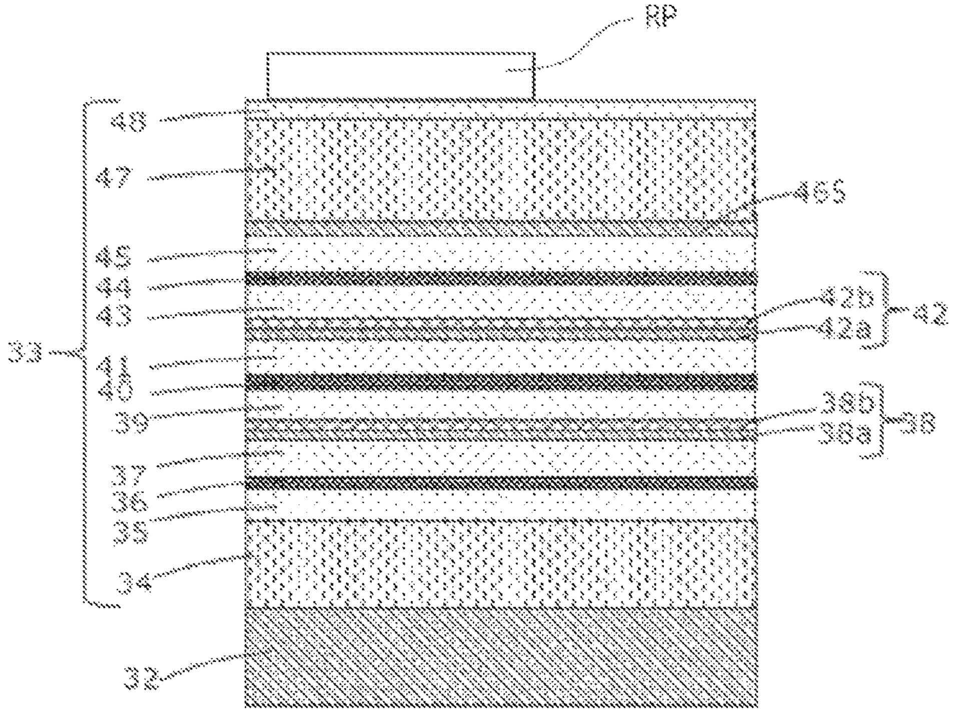
FIG. 9 is a cross-sectional view illustrating a first sub-step of a second step in FIG. 7.

First, for example, a resist pattern RP for forming the mesa portion 50 is formed on the stack (see FIG. 9).

Figure 10:
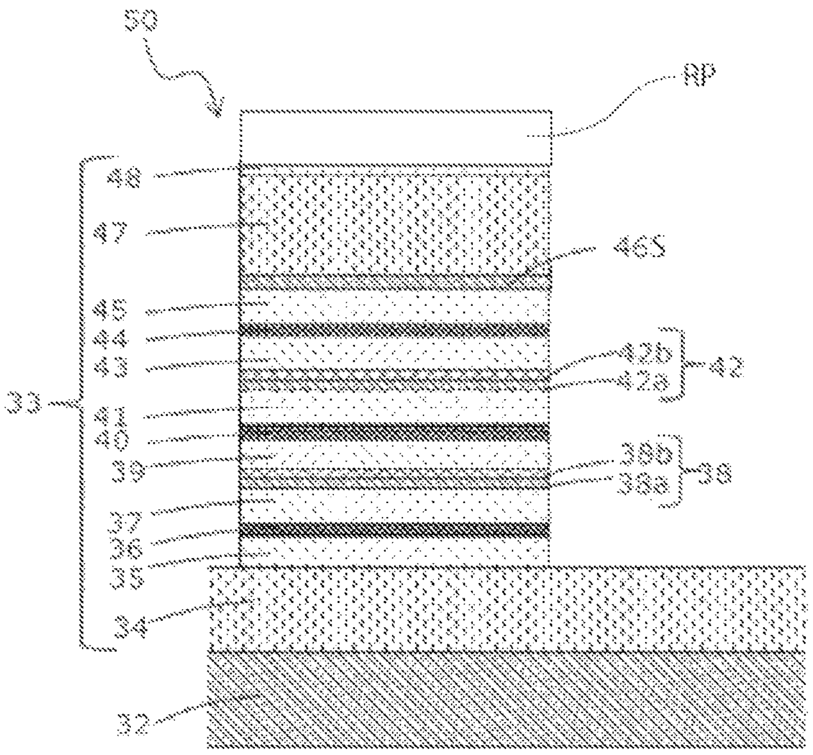
FIG. 10 is a cross-sectional view illustrating a second sub-step of the second step in FIG. 7.

Next, using this resist pattern RP as a mask, the stack is etched by, for example, RIE etching (reactive ion etching) until at least the first multilayer film reflector 34 is exposed, thereby forming the mesa portion 50 (see FIG. 10). As an example, the etching here is performed, for example, until the etching bottom surface is located in the first multilayer film reflector 34. At this time, the side surface of the selectively oxidized layer 46S is exposed.

Figure 11:
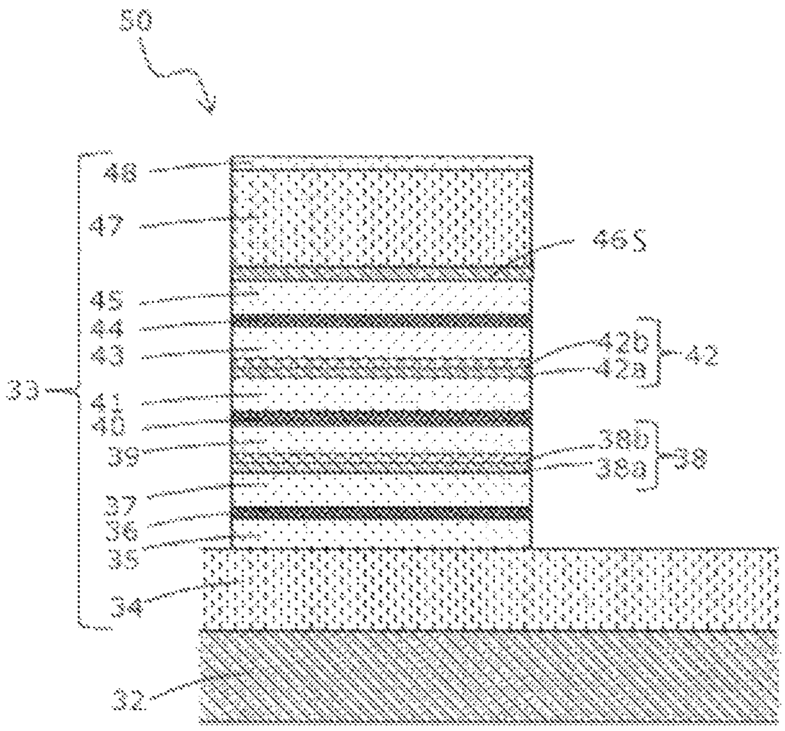
FIG. 11 is a cross-sectional view illustrating a third sub-step of the second step in FIG. 7.
Figure 12:
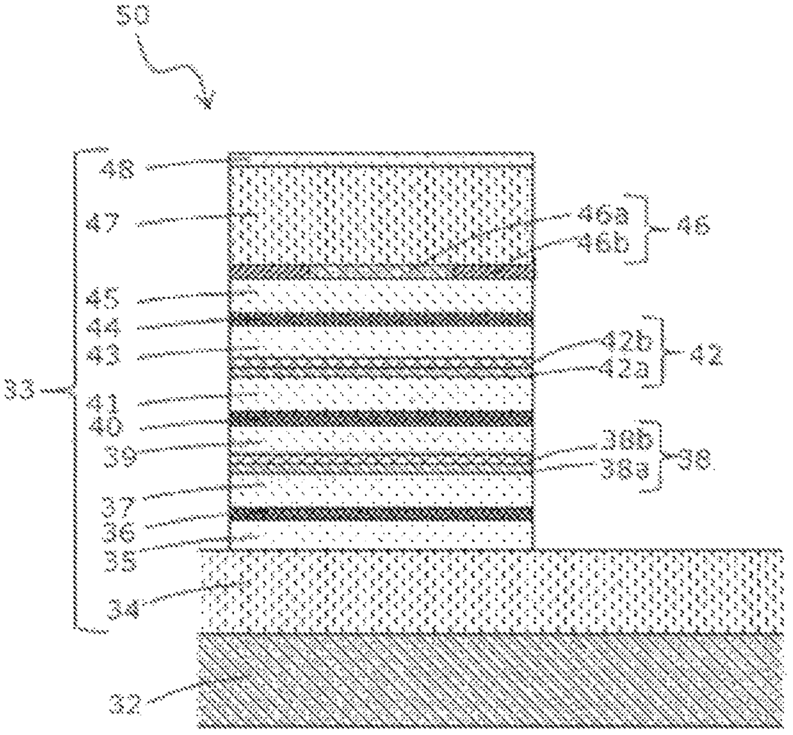
FIG. 12 is a cross-sectional view illustrating a third step in FIG. 7.

Finally, the resist pattern RP is removed by dry etching or wet etching (see FIG. 11).

In the next step S3, an oxide confinement layer 46 is formed. Specifically, the oxidation treatment is performed at a high temperature in a water vapor atmosphere, and Al contained in the selectively oxidized layer 46S is selectively oxidized from the side surface of the mesa portion 50. Alternatively, Al contained in the selectively oxidized layer 46S is selectively oxidized from the side surface of the mesa portion 50 by a wet oxidation method. As a result, in the mesa portion 50, the outer edge region of the selectively oxidized layer 46S becomes an insulating layer (aluminum oxide), and the oxide confinement layer 46 is formed (see FIG. 12).

Figure 13:
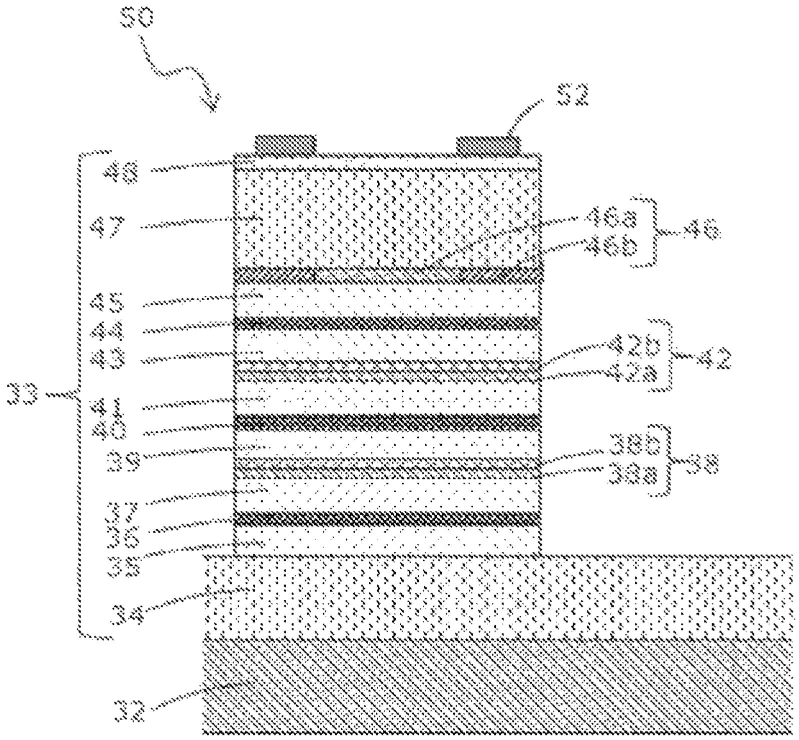
FIG. 13 is a cross-sectional view illustrating a fourth step in FIG. 7.

In the next step S4, an anode electrode 52 is formed (see FIG. 13). Specifically, after a film of an electrode material is formed on the mesa portion 50 by, for example, a sputtering method, a vapor deposition method, or the like, the ring-shaped anode electrode 52 is formed at the top of the mesa portion 50 by, for example, a lift-off method.

Figure 14:
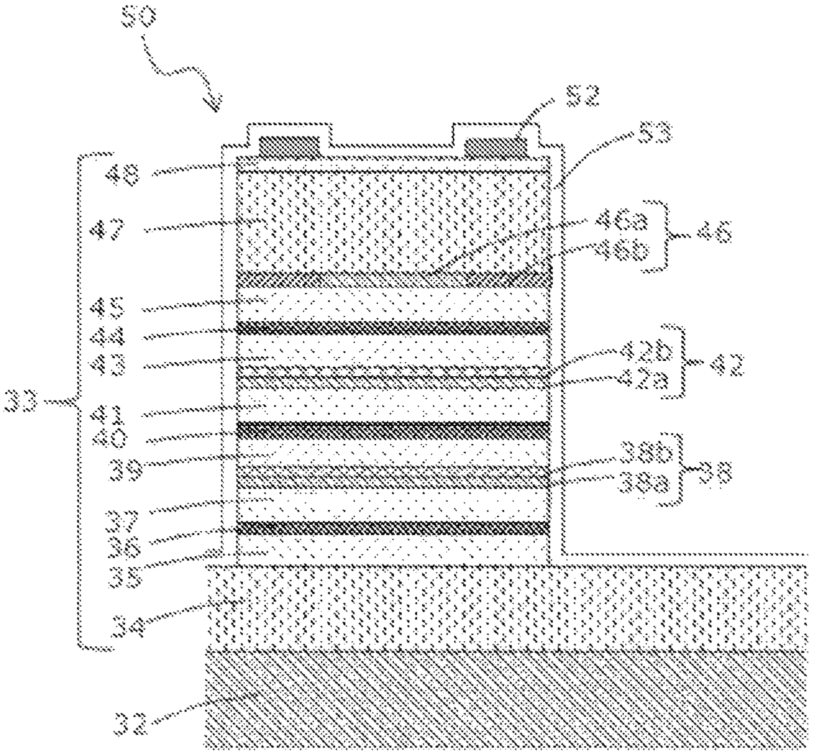
FIG. 14 is a cross-sectional view illustrating a fifth step in FIG. 7.
Figure 15:
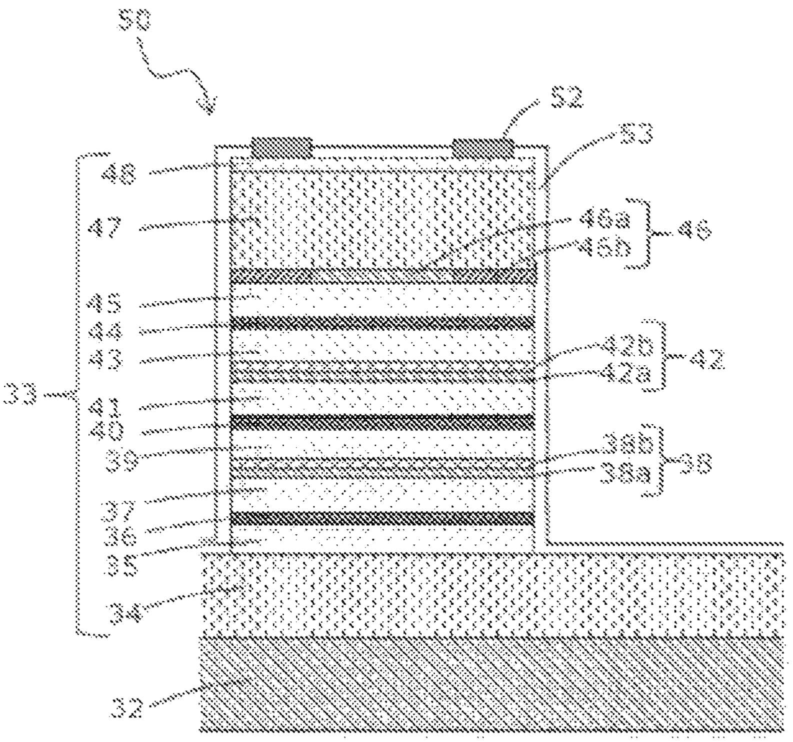
FIG. 15 is a cross-sectional view illustrating a sixth step in FIG. 7.

In the next step S5, an insulating film 53 is formed (see FIG. 14). Specifically, the insulating film 53 is formed on the mesa portion 50 on which the anode electrode 52 is formed and a peripheral portion of the mesa portion 50 by, for example, a CVD method or the like.

In the next step S6, a part of the insulating film 53 is removed. Specifically, the insulating film 53 on the anode electrode 52 and on the inner peripheral side of the anode electrode 52 is removed by dry etching or wet etching (see FIG. 15). As a result, the anode electrode 52 and the emission surface are exposed.

Figure 16:
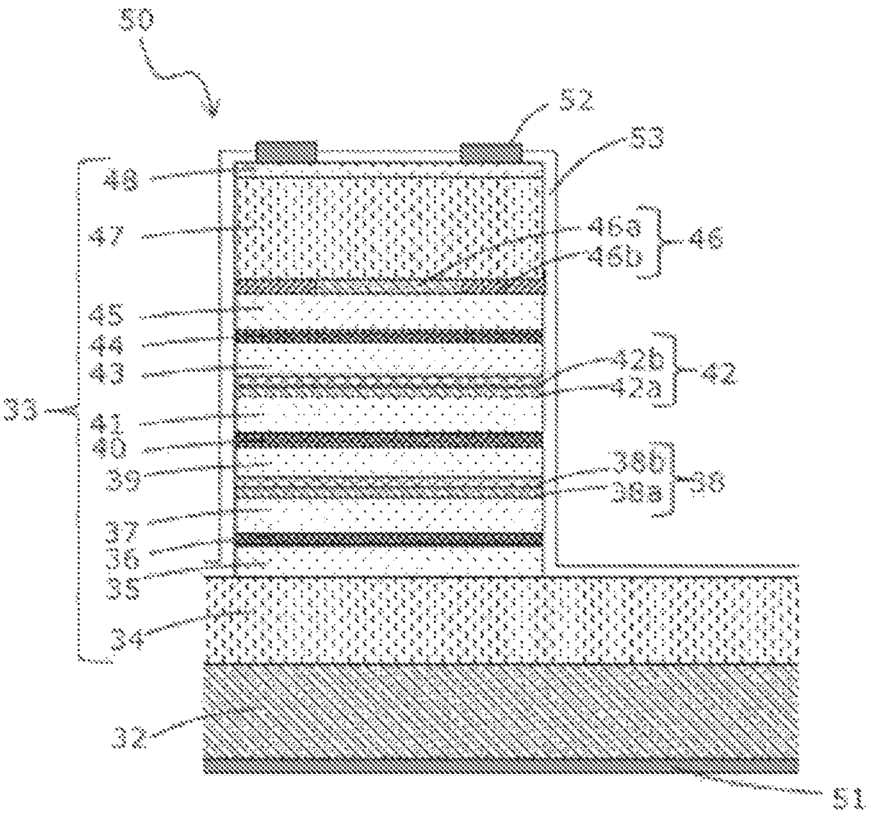
FIG. 16 is a cross-sectional view illustrating a seventh step in FIG. 7.

In the next step S7, a cathode electrode 51 is formed (see FIG. 16). Specifically, the back surface (lower surface) of the substrate 32 is polished to be thinned, and then a film of an electrode material is formed on the back surface by a sputtering method, a vapor deposition method, or the like to form the cathode electrode 51.

Thereafter, a portion of the insulating film 53 to be diced is removed, and then dicing is performed to obtain a plurality of the chip-shaped surface emitting lasers 1.

(4) Effects of Surface Emitting Laser

The surface emitting laser 1 of the first embodiment includes first and second multilayer film reflectors 4 and 17, the first to third active regions 6, 10, and 14 stacked between the first and second multilayer film reflectors 4 and 17, the first tunnel junction 8 disposed between the first and second active regions 6 and 10 that are adjacent to each other, and the second tunnel junction 12 disposed between the second and third active regions 10 and 14 that are adjacent to each other. Each of the first to third active regions 6, 10, and 14 includes at least one well layer (active layer), and the first to third active regions 6, 10, 14 are different from each other in at least one of a composition of the well layer, a thickness of the well layer, and the number of the well layers.

In this case, the driving temperature range in which desired light emission characteristics can be obtained can be widened.

As a result, according to the surface emitting laser 1 of the first embodiment, it is possible to provide the surface emitting laser capable of stabilizing the light emission characteristics with respect to change in the driving temperature.

In the first to third active regions 6, 10, and 14, the peak wavelengths λP1, λP2, and λP3 of emission spectra ES1, ES2, and ES3 are different from each other. As a result, the driving temperature range in which desired light emission characteristics can be obtained can be reliably widened.

In the first to third active regions 6, 10, and 14, the peak wavelengths of the emission spectra ES1, ES2, and ES3 are shorter as the region is closer to the emission surface ExS of the surface emitting laser 1. As a result, the driving temperature range in which desired light emission characteristics can be obtained while reducing the light absorption loss can be reliably widened.

In the first to third active regions 6, 10, and 14, the composition of the element having the largest lattice constant (for example, In) among the elements included in the well layer may be smaller as the region is closer to the emission surface ExS of the surface emitting laser 1.

In the first to third active regions 6, 10, and 14, the thickness of the well layer may be smaller as the region is closer to the emission surface ExS of the surface emitting laser 1.

The first to third active regions 6, 10, and 14 may have larger numbers of well layers as being closer to the emission surface ExS of the surface emitting laser 1.

The difference λP1−λP2 between the peak wavelengths of the emission spectra ES1 and ES2 of the first and second active regions 6 and 10 that are adjacent to each other and the difference λP2−λP3 between the peak wavelengths of the emission spectra ES2 and ES3 of the second and third active regions 10 and 14 that are adjacent to each other are preferably 5 nm or more and 50 nm or less.

Both of the difference λP1−λP2 between the peak wavelengths of the emission spectra ES1 and ES2 of the first and second active regions 6 and 10 that are adjacent to each other and the difference λP2−λP3 between the peak wavelengths of the emission spectra ES2 and ES3 of the second and third active regions 10 and 14 that are adjacent to each other are more preferably 15 nm or more and 30 nm or less.

The difference λP1−λP3 between the peak wavelengths of the first active region 6 where the peak wavelength of the emission spectrum is the longest and the third active region 14 where the peak wavelength is the shortest among the first to third active regions 6, 10, and 14 is preferably 30 nm or more and 60 nm or less.

The difference λP1−λP2 between the peak wavelengths of the emission spectra ES1 and ES2 of the first and second active regions 6 and 10 that are adjacent to each other may be the same as the difference λP2−λP3 between the peak wavelengths of the emission spectra ES2 and ES3 of the second and third active regions 10 and 14 that are adjacent to each other.

The difference λP1−λP2 between the peak wavelengths of the emission spectra ES1 and ES2 of the first and second active regions 6 and 10 that are adjacent to each other may be different from the difference λP2−λP3 between the peak wavelengths of the emission spectra ES2 and ES3 of the second and third active regions 10 and 14 that are adjacent to each other.

The well layer (active layer) preferably includes $In_xGa_{1-x}As$ ($0 \leq x \leq 1.0$).

Each of the first to third active regions 6, 10, and 14 may include a barrier layer (semiconductor layer) including $Al_yGa_{1-y}As$ ($0 \leq y \leq 1.0$).

The tunnel junction is preferably disposed at least between the first active region 6 farthest from the emission surface ExS of the surface emitting laser 1 among the first to third active regions 6, 10, and 14 and the second active region 10 adjacent to the first active region 6.

The tunnel junction is more preferably disposed between all adjacent active regions.

Figure 17:
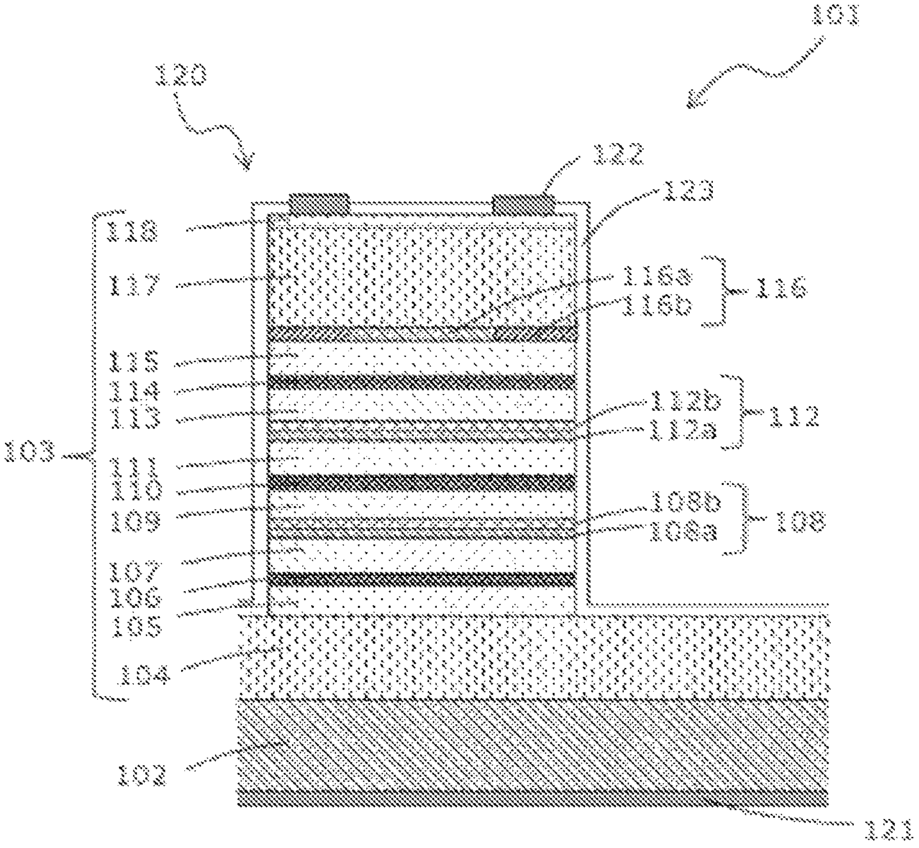
FIG. 17 is a cross-sectional view of a surface emitting laser according to a second embodiment of the present technology.

3. Surface Emitting Laser According to Second Embodiment of Present Technology Hereinafter, a surface emitting laser according to a second embodiment of the present technology will be described with reference to FIG. 17. FIG. 17 is a cross-sectional view of a surface emitting laser 101 according to the second embodiment.

The surface emitting laser of the second embodiment has a configuration similar to that of the surface emitting laser 101 of the first embodiment except that emission spectra ES1, ES2, and ES3 of first to third active regions have waveforms illustrated in FIG. 5A.

In the surface emitting laser 101, as illustrated in FIG. 5A, the difference λP1−λP2 between the peak wavelengths of the emission spectra ES1 and ES2 in the first and second active regions that are adjacent to each other may be different from the difference λP2−λP3 between the peak wavelengths of the emission spectra ES2 and ES3 of the second and third active regions that are adjacent to each other.

More specifically, in the example of FIG. 5A, the peak wavelength λP3 of the emission spectrum ES3 is shifted to the short wavelength side from the example of FIG. 4A, and λP2−λP3>λP1−λP2 is satisfied.

As illustrated in FIG. 5B, the waveform and Δλ when the emission spectra ES1 to ES3 of FIG. 5A are superimposed are shifted to the short wavelength side from the example of FIG. 4B. In this case, the possibility that the oscillation wavelength becomes out of Δλ can be suppressed even when the driving temperature changes to a higher temperature side.

As illustrated in FIG. 17, the surface emitting laser 101 of the second embodiment includes, as an example, a substrate 102, first and second multilayer film reflectors 104 and 117, first to third active regions 106, 110, and 114, first and second tunnel junctions 108 and 112, an oxide confinement layer 116, a first n-side spacer layer 105, a first p-side spacer layer 107, a second n-side spacer layer 109, a second p-side spacer layer 111, a third n-side spacer layer 113, a third p-side spacer layer 115, a contact layer 118, an anode electrode 122, a cathode electrode 121, and an insulating film 123.

The oxide confinement layer 116 includes a current injection region 116*a* and a current confinement region 116*b* surrounding the current injection region 116*a*.

The first tunnel junction 108 includes a first high-concentration p-type layer 108*a* and a first high-concentration n-type layer 108*b*. The second high-concentration n-type layer 108*b* is disposed on the upper side (anode electrode 122 side) of the first high-concentration p-type layer 108*a*.

The second tunnel junction 112 includes a second high-concentration p-type layer 112*a* and a second high-concentration n-type layer 112*b*. The second high-concentration n-type layer 112*b* is disposed on the upper side (anode electrode 122 side) of the second high-concentration p-type layer 112*a*.

In the surface emitting laser 101, as an example, a portion of the first multilayer film reflector 104 of a stacked structure 103 excluding a portion (lower portion) is a mesa portion 120 protruding in a direction perpendicular to the substrate 102.

The first active region 106 has, for example, a multiple quantum well structure in which well layers including undoped $In_{x106w}Ga_{1-x106w}As$ ($0<x106w<1$) and barrier layers including undoped $Al_{x106b}Ga_{1-x106b}As$ ($0<x106b<1$) are alternately stacked.

The second active region 110 has, for example, a multiple quantum well structure in which well layers including undoped $In_{x110w}Ga_{1-x110w}As$ ($0\leq x110w<1$) and barrier layers including undoped $Al_{x110b}Ga_{1-x110b}As$ ($0<x110b<1$) are alternately stacked.

The third active region 110 has, for example, a multiple quantum well structure in which well layers including undoped $In_{x114w}Ga_{1-x114w}As$ ($0<x114w<1$) and barrier layers including undoped $Al_{x114b}Ga_{1-x114b}As$ ($0<x114b<1$) are alternately stacked.

In composition x106w of the well layers in the first active region 106, In composition x110w of the well layers in the second active region 110, and In composition x114w of the well layers in the third active region 114 have a relationship of x106w>x110w>x114w, and a difference between x106w and x110w is larger than a difference between x110w and x114w.

According to the surface emitting laser 101 of the second embodiment, an effect similarly to that of the surface emitting laser 1 is obtained, and since the waveform obtained by superimposing the emission spectra of the first to third active regions 106, 110, and 114 is shifted to the short wavelength side, the possibility that the oscillation wavelength becomes out of the wavelength range $\Delta\lambda$ enabling the high gain Gh can be suppressed even when the driving temperature changes to the high temperature side (see FIG. 5B).

Note that, in the surface emitting laser 101 of the second embodiment, in addition to or instead of making the In composition different as described above, the thicknesses of the well layers in the active regions may be made different, or the numbers of well layers in the active regions may be made different similarly to the surface emitting laser 1 of the first embodiment.

The surface emitting laser 101 of the second embodiment can also be manufactured by a manufacturing method according to the manufacturing method of the surface emitting laser 1 of the first embodiment described above.

4. Surface Emitting Laser According to Modification of Second Embodiment of Present Technology A surface emitting laser according to a modification of the second embodiment has a configuration similar to that of the surface emitting laser 101 of the second embodiment except that a difference between the In composition x106w of the well layers in the first active region 106 and the In composition x110w of the well layers in the third active region 110 is smaller than a difference between the In composition x110w of the well layers in the second active region 110 and the In composition x114w of the well layers in the third active region 114.

That is, in the surface emitting laser of the modification of the second embodiment, emission spectra ES1, ES2, and ES3 of first to third active regions have waveforms illustrated in FIG. 6A.

According to the surface emitting laser of the modification of the second embodiment, an effect similar to that of the surface emitting laser 1 is obtained, and since the waveform obtained by superimposing the emission spectra ES1, ES2, and ES3 of the first to third active regions is shifted to the long wavelength side (see FIG. 6B), the possibility that the oscillation wavelength becomes out of the wavelength range $\Delta\lambda$ enabling the high gain Gh can be suppressed even when the driving temperature changes to the low temperature side (see FIG. 6B).

Note that, in the surface emitting laser of the modification of the second embodiment, in addition to or instead of making the In composition different as described above, the thicknesses of the well layers in the active regions may be made different, or the numbers of well layers in the active regions may be made different similarly to the surface emitting laser 1 of the first embodiment.

The surface emitting laser of the modification of the second embodiment can also be manufactured by a manufacturing method according to the manufacturing method of the surface emitting laser 1 of the first embodiment described above.

Figure 18:
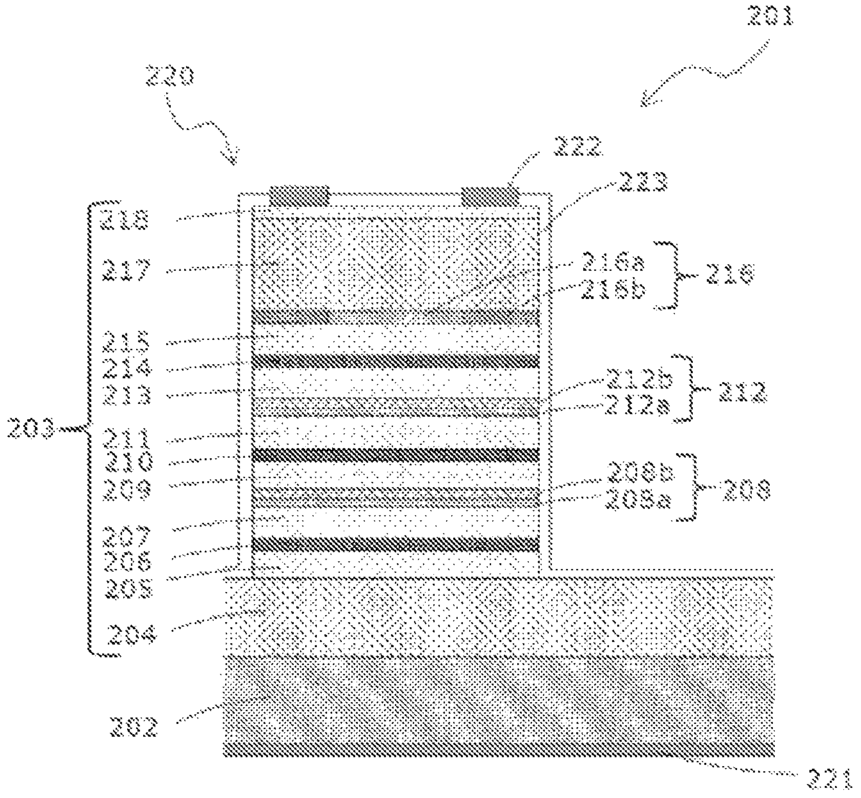
FIG. 18 is a cross-sectional view of a surface emitting laser according to a third embodiment of the present technology.

5. Surface Emitting Laser According to Third Embodiment of Present Technology Hereinafter, a surface emitting laser according to a third embodiment of the present technology will be described with reference to FIG. 18. FIG. 18 is a cross-sectional view of a surface emitting laser 201 according to the third embodiment.

The surface emitting laser 201 of the third embodiment has a configuration similar to that of the surface emitting laser 1 of the first embodiment except that the first and second tunnel junctions have higher impurity doping concentrations as the first and second tunnel junctions are farther from the emission surface of the surface emitting laser 201.

As illustrated in FIG. 18, the surface emitting laser 201 of the third embodiment includes, as an example, a substrate 202, first and second multilayer film reflectors 204 and 217, first to third active regions 206, 210, and 214, first and second tunnel junctions 208 and 212, an oxide confinement layer 216, a first n-side spacer layer 205, a first p-side spacer layer 207, a second n-side spacer layer 209, a second A-side spacer layer 211, a third n-side spacer layer 213, a third p-side spacer layer 215, a contact layer 218, an anode electrode 222, a cathode electrode 221, and an insulating film 223.

The oxide confinement layer 216 includes a current injection region 216*a* and a current confinement region 216*b* surrounding the current injection region 216*a*.

The first tunnel junction 208 includes a first high-concentration p-type layer 208*a* and a first high-concentration n-type layer 208*b*. The second high-concentration n-type layer 208*b* is disposed on the upper side (anode electrode 222 side) of the first high-concentration p-type layer 208*a*.

The second tunnel junction 212 includes a second high-concentration p-type layer 212*a* and a second high-concentration n-type layer 212*b*. The second high-concentration n-type layer 212*b* is disposed on the upper side (anode electrode 222 side) of the second high-concentration p-type layer 212*a*.

In the surface emitting laser 201, as an example, a portion excluding a part (lower portion) of the first multilayer film reflector 204 of the stacked structure 203 is a mesa portion 220 protruding in a direction perpendicular to the substrate 202.

More specifically, the first high-concentration p-type layer 208*a* is doped with p-type impurity such as carbon (C) of $1.0\times10^{20}$ $cm^{-3}$, and has a film thickness of nm, for example. More specifically, the first high-concentration n-type layer 208*b* is doped with n-type impurity such as silicon (Si) of $5.0\times10^{19}$ $cm^{-3}$, and has a film thickness of 10 nm, for example.

More specifically, the second high-concentration p-type layer 212*a* is doped with p-type impurity such as carbon (C) of $7.0\times10^{19}$ $cm^{-3}$, and has a film thickness of 10 nm, for example. More specifically, the second high-concentration n-type layer 212*b* is doped with n-type impurity such as silicon (Si) of $3.0\times10^{19}$ $cm^{-3}$, and has a film thickness of 10 nm, for example.

That is, out of the first and second tunnel junctions 208 and 212, the first high-concentration p-type layer 208*a* of the first tunnel junction 208 farther from the emission surface of the surface emitting laser 201 has a higher impurity doping concentration than the second high-concentration p-type layer 212*a* of the second tunnel junction 212. Among the first and second tunnel junctions 208 and 212, the first high-concentration n-type layer 208*b* of the first tunnel junction 208 farther from the emission surface of the surface emitting laser 201 has a higher impurity doping concentration than the second high-concentration n-type layer 212*b* of the second tunnel junction 212.

According to the surface emitting laser 201 of the third embodiment, the carrier concentration generated from the first tunnel junction 208 becomes higher than the carrier concentration generated from the second tunnel junction 212, and more carriers are injected into the first active region 206. As a result, the waveform of the emission spectrum of the first active region 206 increases (the gain obtained at the peak wavelength of the emission spectrum increases), and the possibility that the oscillation wavelength becomes out of the wavelength range enabling the high gain in the waveform obtained by superimposing the emission spectra can be suppressed even when the driving temperature changes to the higher temperature side.

The surface emitting laser 201 of the third embodiment can also be manufactured by a manufacturing method according to the manufacturing method of the surface emitting laser 1 of the first embodiment described above.

6. Modification of Present Technology

The present technology is not limited to each of the embodiments and modifications described above, and various modifications can be made.

Figure 19:
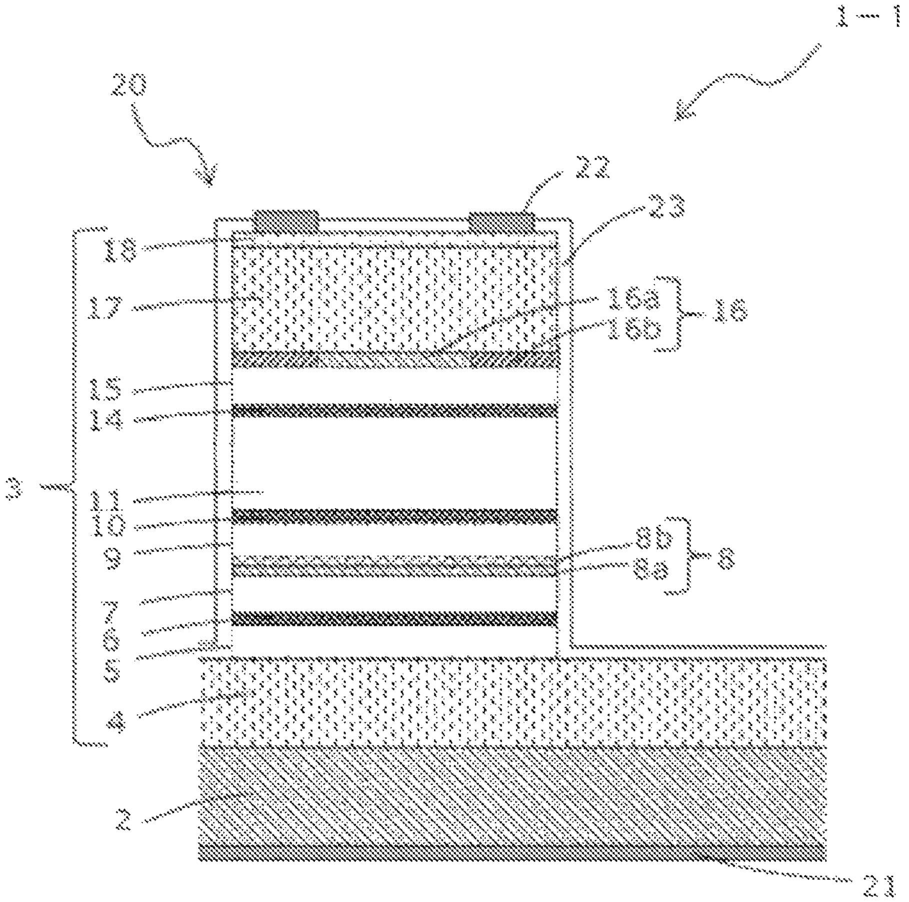
FIG. 19 is a cross-sectional view of a surface emitting laser according to Modification 1 of the first embodiment of the present technology.

For example, as in a surface emitting laser 1-1 of Modification 1 of the first embodiment illustrated in FIG. 19, the tunnel junction is not necessarily be disposed at least between the third active region 14 closest to the emission surface of the surface emitting laser 1-1 and the second active region 10 adjacent to the third active region 14.

The surface emitting laser 1-1 of Modification 1 has a configuration similar to that of the surface emitting laser 1 of the first embodiment except that it does not have a second tunnel junction 12.

The surface emitting laser of each of the above-described embodiments and modifications has three active regions, but the number of the active regions is not limited thereto, and the surface emitting laser may have two active regions or four or more active regions. In any case, it is sufficient that the tunnel junction is provided between at least one set of two adjacent active regions, and it is preferable that the tunnel junction is provided between at least the active region farthest from the emission surface and the active region adjacent to the active region, and it is more preferable that the tunnel junction is provided between all two adjacent active regions.

Figure 20:
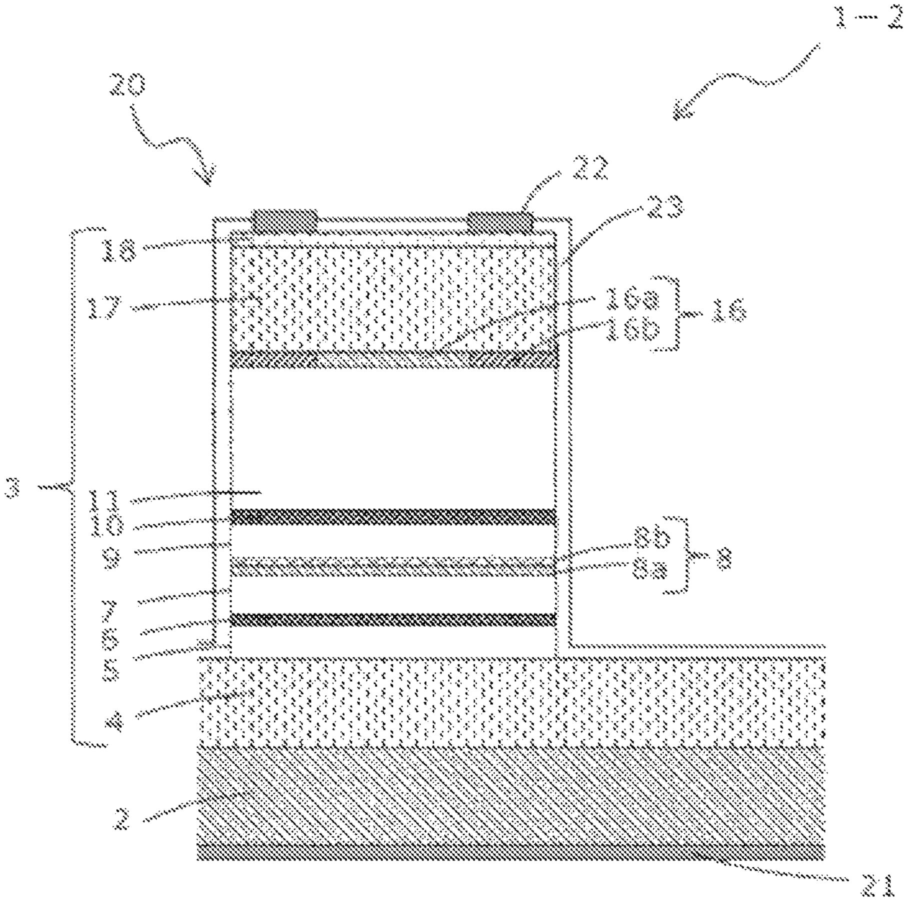
FIG. 20 is a cross-sectional view of a surface emitting laser according to Modification 2 of the first embodiment of the present technology.

For example, as in a surface emitting laser 1-2 of Modification 2 of the first embodiment illustrated in FIG. 20, the surface emitting laser may include two active regions (for example, the first and second active regions 6 and 10) and a tunnel junction (for example, a first tunnel junction 8) disposed between the two active regions.

The surface emitting laser 1-2 of Modification 2 has a configuration similar to that of the surface emitting laser 1 of the first embodiment except that it does not have a third active region 14 or a second tunnel junction 12.

Figure 21:
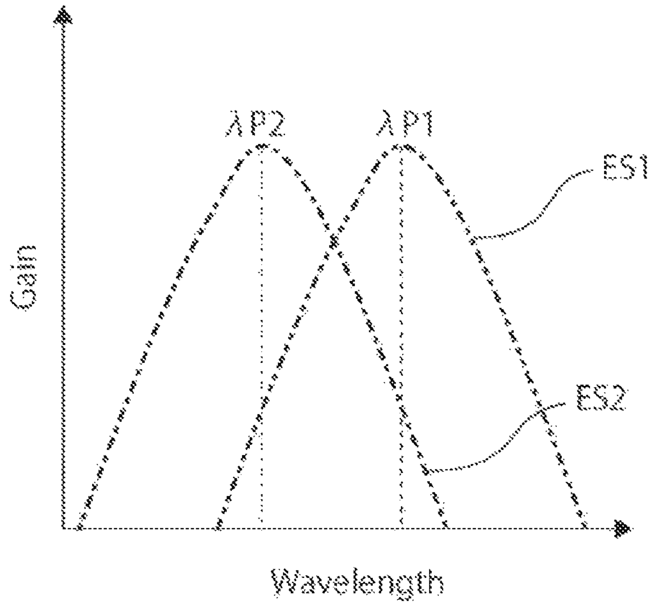
FIG. 21A is a diagram illustrating an emission spectrum in each active region of the surface emitting laser in FIG. 20.
FIG. 21B is a diagram illustrating a waveform obtained by superimposing emission spectra in FIG. 21A.
Figure 21:
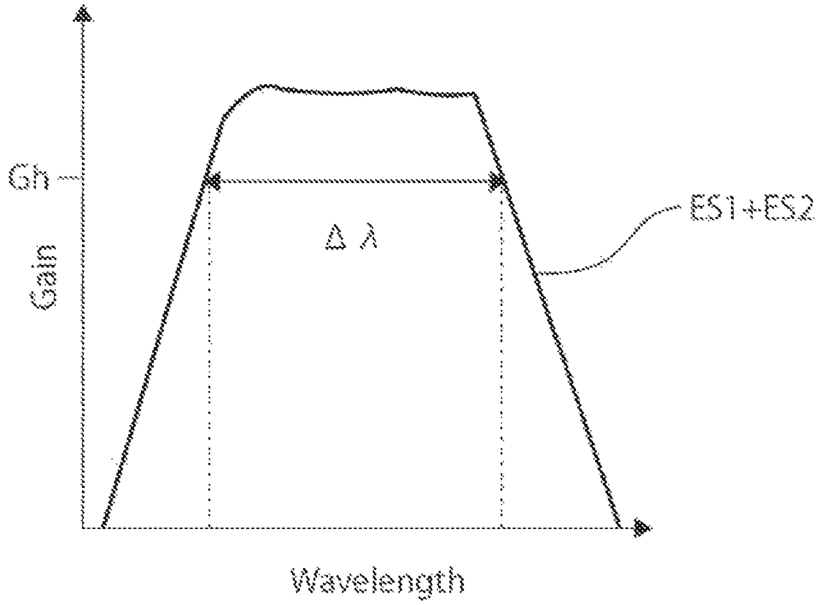

In the surface emitting laser 1-2, the first and second active regions 6 and 10 have, for example, emission spectra ES1 and ES2 illustrated in FIG. 21A, and a waveform obtained by superimposing the emission spectra ES1 and ES2 is as illustrated in FIG. 21B (the waveform has Δλ shorter than that in the example of FIG. 4B).

Figure 22:
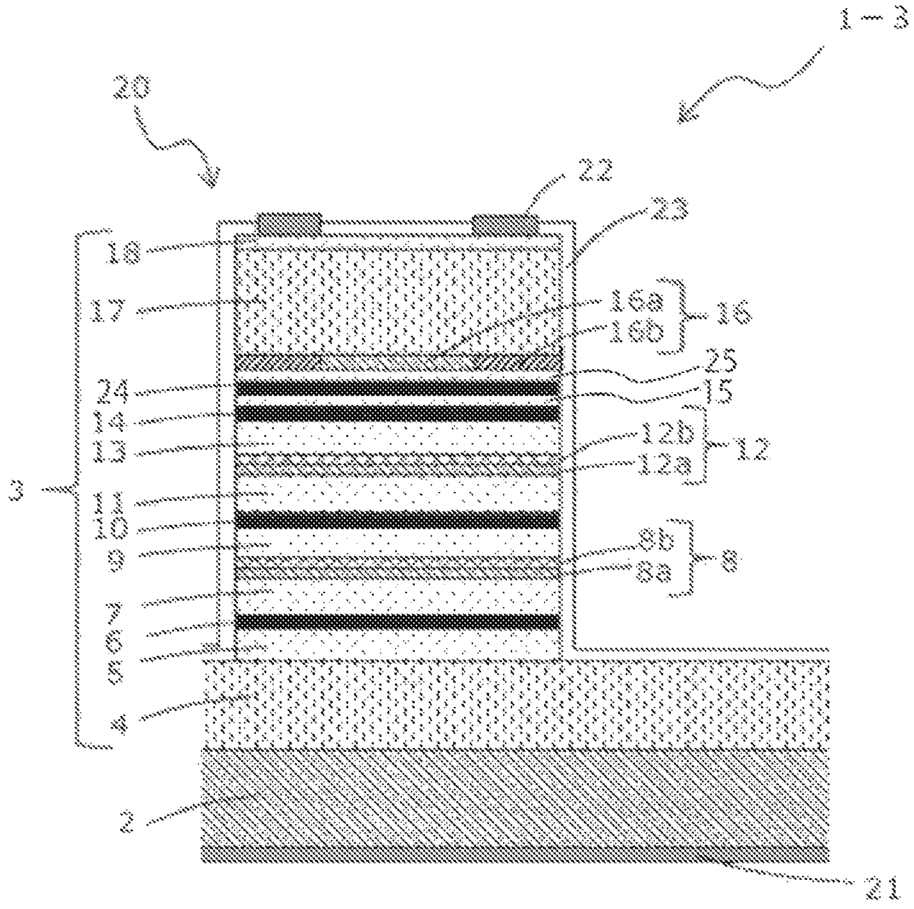
FIG. 22 is a cross-sectional view of a surface emitting laser according to Modification 3 of the first embodiment of the present technology.

For example, as in a surface emitting laser 1-3 of a Modification 3 of the first embodiment illustrated in FIG. 22, the surface emitting laser may have four active regions (for example, first to fourth active regions 6, 10, 14, and 24).

The surface emitting laser 1-3 of Modification 3 has a configuration similar to that of the surface emitting laser 1 of the first embodiment except that the fourth active region 24 is provided between the oxide confinement layer 16 and the second tunnel junction 12 in addition to the third active region 14, and a spacer layer 25 between the fourth active region 24 and the oxide confinement layer 16.

Figure 23:
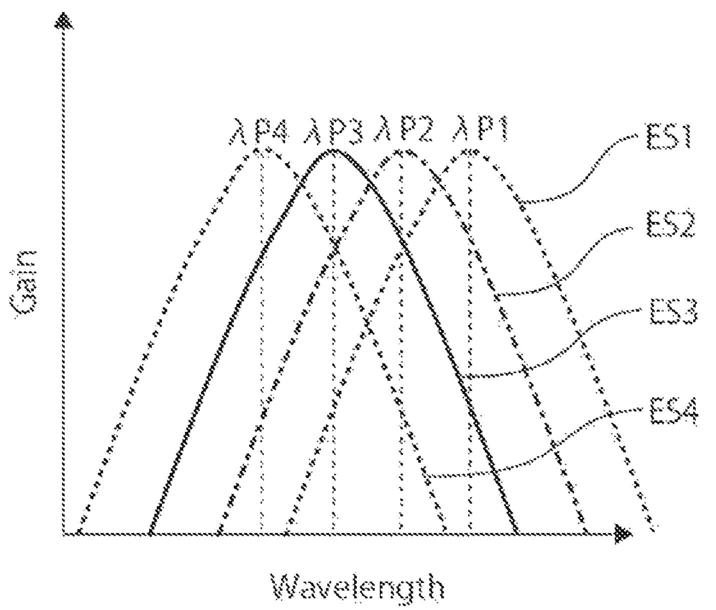
FIG. 23A is a graph indicating emission spectrum in each active region of a surface emitting laser in FIG. 22.
FIG. 23B is a diagram illustrating a waveform obtained by superimposing emission spectra in FIG. 23A.
Figure 23:
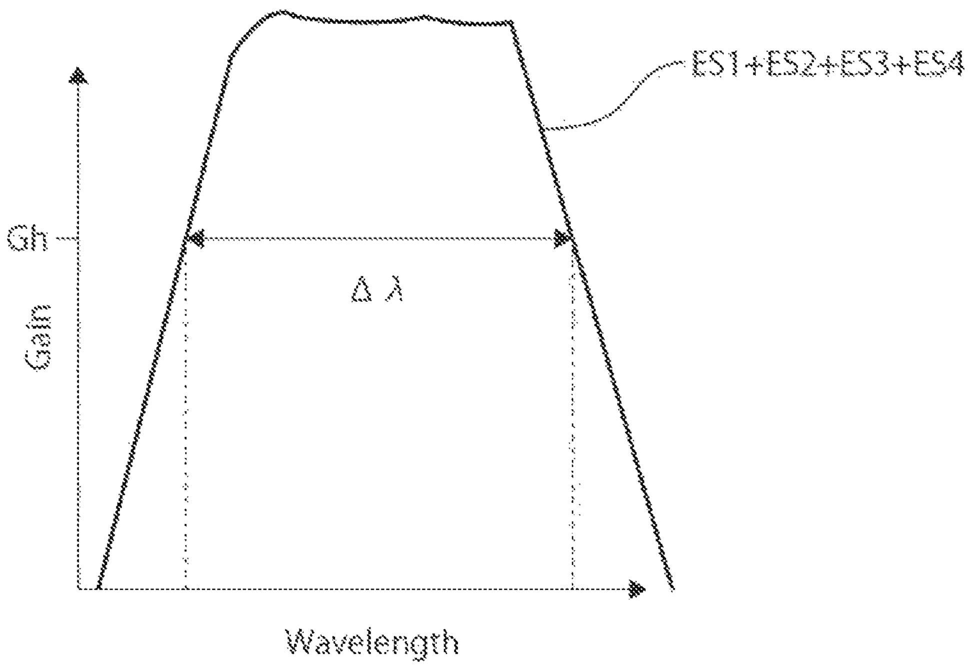

Note that the surface emitting laser 1-3 may have a tunnel junction also between the third and fourth active regions 14 and 24. In this case, the first to fourth active regions 6, 10, 14, and 24 have, for example, the emission spectra ES1, ES2, ES3, and ES4 illustrated in FIG. 23A, and a waveform obtained by superimposing the emission spectra ES1, ES2, ES3, and ES4 is as illustrated in FIG. 23B (the waveform has Δλ longer than that in the example of FIG. 4B).

For example, in the surface emitting laser of each of the above-described embodiments and modifications, the p-type and the n-type as the conduction types of the semiconductor may be reversed. Furthermore, in the plurality of active regions, it is sufficient if at least two active regions differ in the composition of an element having the largest lattice constant (for example, In) among the elements included in the well layers, in the thickness of the well layers, and/or in the number of the well layers, and there may be at least two active regions that are the same in all of the composition, the thickness, and the number described above (for example, the peak wavelengths of the emission spectra are the same).

In other words, in the plurality of active regions, it is sufficient if the peak wavelengths of the emission spectra are different between at least two active regions, and there may be at least two active regions having the same peak wavelength of the emission spectrum.

In each of the above-described embodiments and modifications, the arsenide semiconductor has been described as an example, but a group III-V semiconductor containing, for example, nitrogen (N), boron (B), antimony (Sb), or phosphorus (P) may be used as necessary. Note that the "arsenide semiconductor" refers to a compound semiconductor containing an arsenic (As) element and containing at least one element of aluminum (Al), gallium (Ga), or indium (In).

In the surface emitting laser of each of the above-described embodiments and modifications, the oxide confinement layer may not necessarily be provided.

In the surface emitting laser of each of the above-described embodiments and modifications, the contact layer may not necessarily be provided.

In the surface emitting laser of each of the above-described embodiments and modifications, at least one active region among the plurality of active regions may have a single quantum well structure having a single well layer.

In each of the above-described embodiments and modifications, both the first and second multilayer film reflectors are semiconductor multilayer film reflectors, but the present technology is not limited thereto.

For example, the first multilayer film reflector may be a semiconductor multilayer film reflector, and the second multilayer film reflector may be a dielectric multilayer film reflector. The dielectric multilayer film reflector is also a kind of distributed Bragg reflector.

For example, the first multilayer film reflector may be a dielectric multilayer film reflector, and the second multilayer film reflector may be a semiconductor multilayer film reflector.

For example, both the first and second multilayer film reflectors may be dielectric multilayer film reflectors.

The semiconductor multilayer film reflector has low light absorption and conductivity. From this viewpoint, the semiconductor multilayer film reflector is suitable for the second multilayer film reflector on the emission side and on the current path from the anode electrode to each active layer.

On the other hand, the dielectric multilayer film reflector has extremely low light absorption. From this viewpoint, the dielectric multilayer film reflector is suitable for the second multilayer film reflector on the emission side.

In each of the above-described embodiments and modifications, the front surface emitting type surface emitting laser that emits laser light from the mesa top has been described as an example, but the present technology is also applicable to a back surface emitting type surface emitting laser that emits laser light from the back surface of the substrate.

In each of the above-described embodiments and modifications, the surface emitting laser has a mesa portion, but the present technology can also be applied to, for example, a gain-guided surface emitting laser having no mesa portion.

In each of the above-described embodiments and modifications, a single surface emitting laser has been described as an example, but the present technology can also provide a surface emitting laser array including a plurality of the surface emitting lasers of any one of the above-described embodiments and modifications. In the surface emitting laser array, the surface emitting lasers are two-dimensionally arranged in, for example, a matrix shape, a zigzag shape, a random shape, or the like.

Some of the configurations of the surface emitting lasers of the embodiments and modifications described above may be combined within a range in which they do not contradict each other.

The characteristics of the surface emitting laser according to the present technology can be determined by, for example, analysis of the film thickness, composition, and impurity concentration of the stacked structure using, for example, a transmission electron microscope (TEM) or secondary ion mass spectrometry (SIMS).

7. Application Example to Electronic Device

The technology according to the present disclosure (present technology) can be applied to various products (electronic devices). For example, the technology according to the present disclosure may be implemented as a device mounted on any type of mobile body such as an automobile, an electric vehicle, a hybrid electric vehicle, a motorcycle, a bicycle, a personal mobility, an airplane, a drone, a ship, and a robot.

The surface emitting laser according to the present technology can also be applied as, for example, a light source of a device that forms or displays an image by laser light (for example, a laser printer, a laser copier, a projector, a head-mounted display, a head-up display, or the like).

8. <Example in which Surface Emitting Laser is Applied to Distance Measuring Device>

Hereinafter, application examples of the surface emitting laser 1 according to the first embodiment described above will be described.

Figure 24:
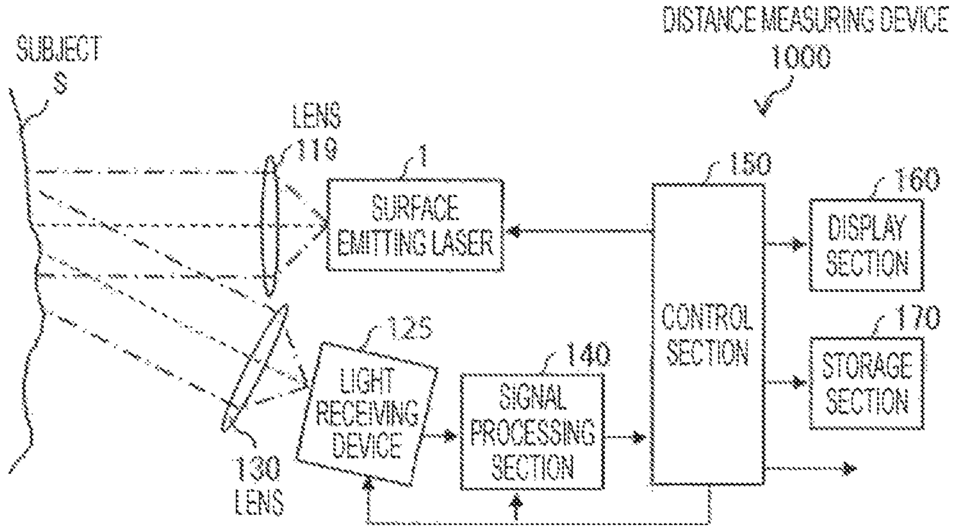
FIG. 24 is a diagram illustrating an application example of a surface emitting laser according to each embodiment of the present technology and its modification to a distance measuring device.

FIG. 24 illustrates an example of a schematic configuration of a distance measuring device 1000 including the surface emitting laser 1 as an example of an electronic device according to the present technology. The distance measuring device 1000 measures the distance to a subject S by a time of flight (TOF) method. The distance measuring device 1000 includes the surface emitting laser 1 as a light source. The distance measuring device 1000 includes, for example, the surface emitting laser 1, a light receiving device 125, lenses 119 and 130, a signal processing section 140, a control section 150, a display section 160, and a storage section 170.

The light receiving device 125 detects light reflected by the subject S. The lens 119 is a lens for collimating the light emitted from the surface emitting laser 1, and is a collimating lens. The lens 130 is a lens for condensing light reflected by the subject S and guiding the light to the light receiving device 125, and is a condenser lens.

The signal processing section 140 is a circuit for generating a signal corresponding to a difference between a signal input from the light receiving device 125 and a reference signal input from the control section 150. The control section 150 includes, for example, a time-to-digital converter (TDC). The reference signal may be a signal input from the control section 150, or may be an output signal of a detection section that directly detects the output of the surface emitting laser 1. The control section 150 is, for example, a processor that controls the surface emitting laser 1, the light receiving device 125, the signal processing section 140, the display section 160, and the storage section 170. The control section 150 is a circuit that measures a distance to the subject S on the basis of a signal generated by the signal processing section 140. The control section 150 generates a video signal for displaying information about the distance to the subject S, and outputs the video signal to the display section 160. The display section 160 displays information about the distance to the subject S on the basis of the video signal input from the control section 150. The control section 150 stores information about the distance to the subject S in the storage section 170.

In the present application example, instead of the surface emitting laser 1, any one of the surface emitting lasers 101, 201, 1-1, 1-2, and 1-3 described above or a surface emitting laser array including a plurality of any of the surface emitting lasers can be applied to the distance measuring device 1000.

9. <Example in which Distance Measuring Device is Mounted on Mobile Body>

Figure 25:
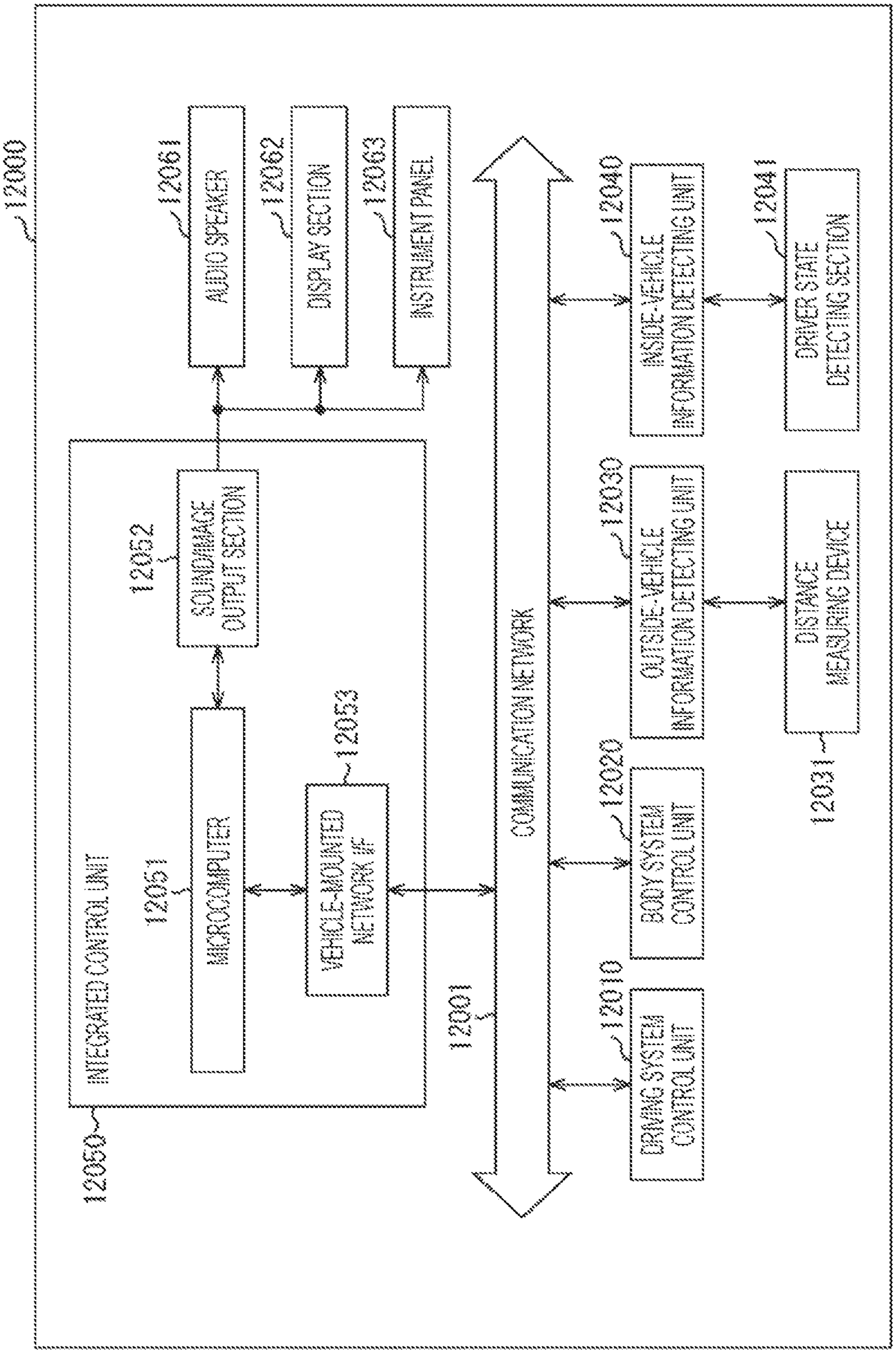
FIG. 25 is a block diagram illustrating an example of a schematic configuration of a vehicle control system.

FIG. 25 is a block diagram illustrating an example of a schematic configuration of a vehicle control system as an example of a mobile body control system to which the technology according to an embodiment of the present disclosure can be applied.

The vehicle control system 12000 includes a plurality of electronic control units connected to each other via a communication network 12001. In the example illustrated in FIG. 25, the vehicle control system 12000 includes a driving system control unit 12010, a body system control unit 12020, an outside-vehicle information detecting unit 12030, an inside-vehicle information detecting unit 12040, and an integrated control unit 12050. Furthermore, a microcomputer 12051, a sound/image output section 12052, and a vehicle-mounted network interface (I/F) 12053 are illustrated as a functional configuration of the integrated control unit 12050.

The driving system control unit 12010 controls the operation of devices related to the driving system of the vehicle in accordance with various kinds of programs. For example, the driving system control unit 12010 functions as a control device for a driving force generating device for generating the driving force of the vehicle, such as an internal combustion engine, a driving motor, or the like, a driving force transmitting mechanism for transmitting the driving force to wheels, a steering mechanism for adjusting the steering angle of the vehicle, a braking device for generating the braking force of the vehicle, and the like.

The body system control unit 12020 controls the operation of various kinds of devices provided to a vehicle body in accordance with various kinds of programs. For example, the body system control unit 12020 functions as a control device for a keyless entry system, a smart key system, a power window device, or various lamps such as a headlamp, a back lamp, a brake lamp, a turn indicator, or a fog lamp. In this case, a radio wave transmitted from a portable device that substitutes for a key or signals of various switches may be input to the body system control unit 12020. The body system control unit 12020 receives these input radio waves or signals, and controls a door lock device, the power window device, the lamps, or the like of the vehicle.

The outside-vehicle information detecting unit 12030 detects information about the outside of the vehicle including the vehicle control system 12000. For example, a distance measuring device 12031 is connected to the outside-vehicle information detecting unit 12030. The distance measuring device 12031 includes the above-described distance measuring device 1000. The outside-vehicle information detecting unit 12030 causes the distance measuring device 12031 to measure a distance to an object (subject S) outside the vehicle, and acquires distance data obtained by the measurement. The outside-vehicle information detecting unit 12030 may perform object detection processing of a person, a vehicle, an obstacle, a sign, or the like on the basis of the acquired distance data.

The inside-vehicle information detecting unit 12040 detects information about the inside of the vehicle. The inside-vehicle information detecting unit 12040 is, for example, connected with a driver state detecting section 12041 that detects the state of a driver. The driver state detecting section 12041 includes, for example, a camera that captures an image of the driver, and the inside-vehicle information detecting unit 12040 may calculate the degree of fatigue or the degree of concentration of the driver or may determine whether or not the driver is dozing off on the basis of the detection information input from the driver state detecting section 12041.

The microcomputer 12051 can calculate a control target value for the driving force generating device, the steering mechanism, or the braking device on the basis of the information about the inside or outside of the vehicle which information is obtained by the outside-vehicle information detecting unit 12030 or the inside-vehicle information detecting unit 12040, and output a control command to the driving system control unit 12010. For example, the microcomputer 12051 can perform cooperative control intended to implement functions of an advanced driver assistance system (ADAS) which functions include collision avoidance or shock mitigation for the vehicle, following driving based on a following distance, vehicle speed maintaining driving, a warning of collision of the vehicle, a warning of deviation of the vehicle from a lane, or the like.

In addition, the microcomputer 12051 can perform cooperative control intended for automated driving, which makes the vehicle to travel autonomously without depending on the operation of the driver, or the like, by controlling the driving force generating device, the steering mechanism, the braking device, or the like on the basis of the information about the outside or inside of the vehicle which information is obtained by the outside-vehicle information detecting unit 12030 or the inside-vehicle information detecting unit 12040.

Furthermore, the microcomputer 12051 can output a control command to the body system control unit 12020 on the basis of the information about the outside of the vehicle acquired by the outside-vehicle information detecting unit 12030. For example, the microcomputer 12051 can perform cooperative control intended to prevent a glare by controlling the headlamp so as to change from a high beam to a low beam, for example, in accordance with the position of a preceding vehicle or an oncoming vehicle detected by the outside-vehicle information detecting unit 12030.

The sound/image output section 12052 transmits an output signal of at least one of a sound or an image to an output device capable of visually or auditorily notifying an occupant of the vehicle or the outside of the vehicle of information. In the example of FIG. 25, an audio speaker 12061, a display section 12062, and an instrument panel 12063 are illustrated as the output device. The display section 12062 may, for example, include at least one of an on-board display or a head-up display.

Figure 26:
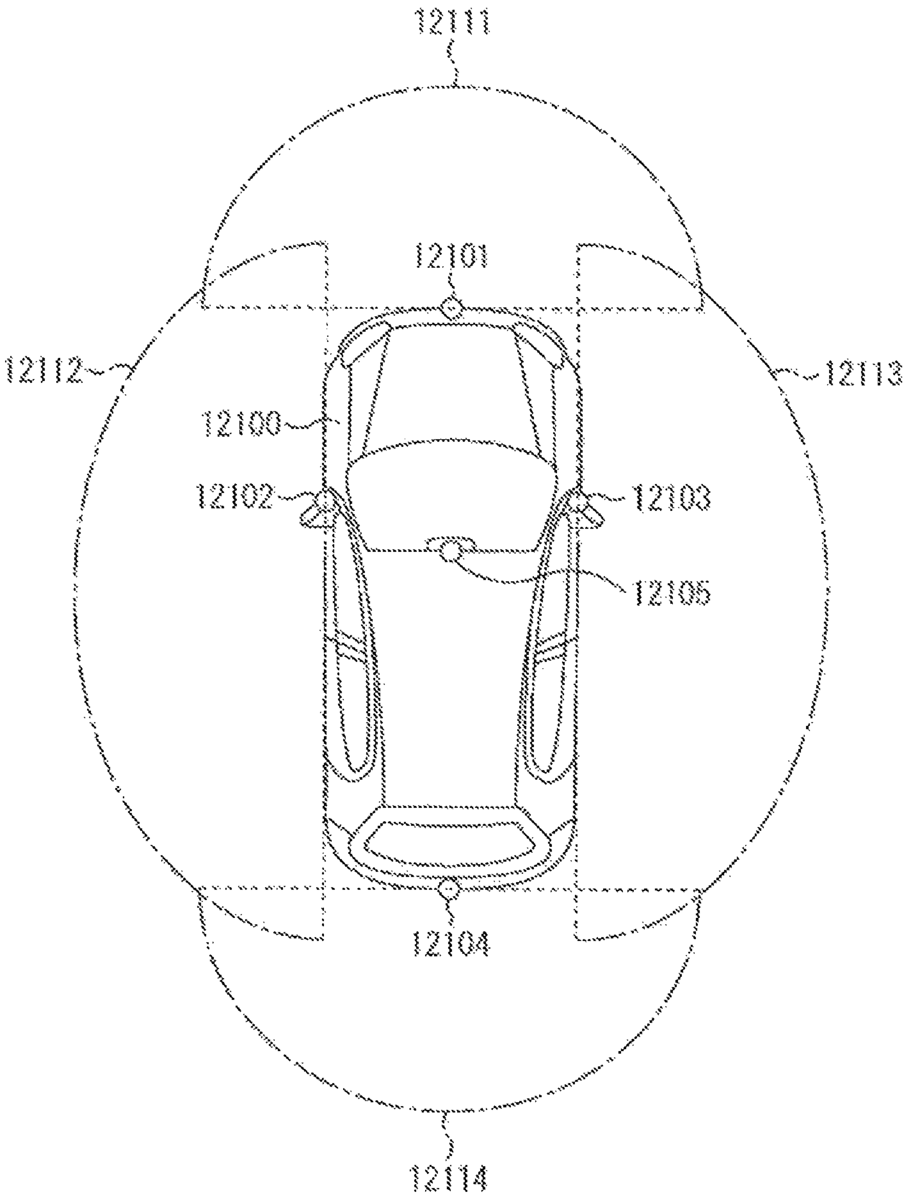
FIG. 26 is an explanatory view illustrating an example of an installation position of the distance measuring device.

FIG. 26 is a view illustrating an example of an installation position of distance measuring device 12031.

In FIG. 26, a vehicle 12100 includes distance measuring devices 12101, 12102, 12103, 12104, and 12105 as the distance measuring device 12031.

The distance measuring devices 12101, 12102, 12103, 12104, and 12105 are provided at positions such as, for example, a front nose, side mirrors, a rear bumper, a back door, and an upper part of a windshield in a vehicle cabin, of the vehicle 12100. The distance measuring device 12101 provided on the front nose and the distance measuring device 12105 provided on the upper part of the windshield in the cabin mainly acquire data of the front side of the vehicle 12100. The distance measuring devices 12102 and 12103 provided at the side mirrors mainly acquire data on the sides of the vehicle 12100. The distance measuring device 12104 provided on the rear bumper or the back door mainly acquires data behind the vehicle 12100. The data of the front side acquired by the distance measuring devices 12101 and 12105 is mainly used for detecting a preceding vehicle, a pedestrian, an obstacle, a traffic light, a traffic sign, or the like.

Note that FIG. 26 illustrates an example of detection ranges of the distance measuring devices 12101 to 12104. A detection range 12111 indicates a detection range of the distance measuring device 12101 provided on the front nose, detection ranges 12112 and 12113 indicate detection ranges of the distance measuring devices 12102 and 12103 provided at the side mirrors, respectively, and a detection range 12114 indicates a detection range of the distance measuring device 12104 provided on the rear bumper or the back door.

For example, the microcomputer 12051 can determine a distance to each three-dimensional object within the detection ranges 12111 to 12114 and a temporal change in the distance (a relative speed with respect to the vehicle 12100) on the basis of the distance data obtained from the distance measuring devices 12101 to 12104, and thereby extract, as a preceding vehicle, a nearest three-dimensional object in particular that is present on a traveling path of the vehicle 12100 and which travels in substantially the same direction as the vehicle 12100 at a predetermined speed (for example, equal to or more than 0 km/hour). Moreover, the microcomputer 12051 can set a following distance to be maintained in front of a preceding vehicle in advance, and perform automatic brake control (including following stop control), automatic acceleration control (including following start control), or the like. In this way, it is possible to perform cooperative control for the purpose of automated driving or the like in which the vehicle autonomously travels without depending on the operation of the driver.

For example, the microcomputer 12051 can classify three-dimensional object data on three-dimensional objects into three-dimensional object data of a two-wheeled vehicle, a standard-sized vehicle, a large-sized vehicle, a pedestrian, a utility pole, and other three-dimensional objects on the basis of the distance data obtained from the distance measuring devices 12101 to 12104, extract the classified three-dimensional object data, and use the extracted three-dimensional object data for automatic avoidance of an obstacle. For example, the microcomputer 12051 identifies obstacles around the vehicle 12100 as obstacles that the driver of the vehicle 12100 can recognize visually and obstacles that are difficult for the driver of the vehicle 12100 to recognize visually. Then, the microcomputer 12051 determines a collision risk indicating a risk of collision with each obstacle, and when the collision risk is equal to or higher than a set value and there is a possibility of collision, the microcomputer 12051 can perform driving assistance for collision avoidance by outputting an alarm to the driver via the audio speaker 12061 or the display section 12062 or performing forced deceleration or avoidance steering via the driving system control unit 12010.

An example of the mobile body control system to which the technology according to the present disclosure can be applied has been described above. The technology according to the present disclosure can be applied to the distance measuring device 12031 among the configurations described above.

The specific numerical values, shapes, materials (including compositions), and the like described in the present description are merely examples, and are not limited thereto.

Furthermore, the present technology can also have the following configurations.

(1) A surface emitting laser including:

first and second multilayer film reflectors;

a plurality of active regions stacked between the first and second multilayer film reflectors; and a tunnel junction disposed between at least one set of two adjacent active regions, in which the plurality of active regions includes at least two of the active regions in which peak wavelengths of emission spectra are different from each other.

(2) The surface emitting laser according to (1), in which each of the plurality of active regions includes at least one active layer, and the at least two active regions are different from each other in at least one of a composition of the active layer, a thickness of the active layer, and the number of the active layers.

(3) The surface emitting laser according to (1) or (2), in which a peak wavelength of the emission spectrum is shorter as the at least two active regions are closer to an emission surface of the surface emitting laser.

(4) The surface emitting laser according to any one of (1) to (3), in which a composition of an element having the largest lattice constant among elements included in the active layer is smaller as the at least two active regions are closer to an emission surface of the surface emitting laser.

(5) The surface emitting laser according any one of (1) to (4), in which a thickness of the active layer is smaller as the at least two active regions are closer to an emission surface of the surface emitting laser.

(6) The surface emitting laser according to any one of (1) to (5), in which the number of the active layers is larger as the at least two active regions are closer to an emission surface of the surface emitting laser.

(7) The surface emitting laser according to any one of (1) to (6), in which the at least two active regions include at least one set of two adjacent active regions, and a difference between peak wavelengths of emission spectra of the at least one set of two adjacent active regions is 5 nm or more and 50 nm or less.

(8) The surface emitting laser according to any one of (1) to (7), in which the at least two active regions include at least one set of two adjacent active regions, and a difference between peak wavelengths of emission spectra of the at least one set of two adjacent active regions is 15 nm or more and 30 nm or less.

(9) The surface emitting laser according to any one of (1) to (8), in which a difference between peak wavelengths in an active region in which an emission spectrum has the longest peak wavelength and an active region in which an emission spectrum has the shortest peak wavelength among the at least two active regions is 30 nm or more and 60 nm or less.

(10) The surface emitting laser according to any one of (1) to (9), in which the plurality of active regions is at least three active regions, and at least two sets of two of the active regions adjacent to each other are different in a difference between peak wavelengths of emission spectra in the two of the active regions adjacent to each other.

(11) The surface emitting laser according to any one of (1) to (10), in which the plurality of active regions is at least three active regions, and at least two sets of two of the active regions adjacent to each other are the same in a difference between peak wavelengths of emission spectra in the two of the active regions adjacent to each other.

(12) The surface emitting laser according to any one of (1) to (11), in which the at least one active layer includes $In_xGa_{1-x}As$ ($0 \leq x \leq 1.0$).

(13) The surface emitting laser according to any one of (1) to (12), in which each of the plurality of active regions includes a semiconductor layer including $Al_yGa_{1-y}As$ ($0 \leq y \leq 1.0$).

(14) The surface emitting laser according to any one of (1) to (13), in which the tunnel junction is disposed at least between the active region farthest from an emission surface of the surface emitting laser among the plurality of active regions and the active region adjacent to the active region.

(15) The surface emitting laser according to any one of (1) to (14), in which the tunnel junction is disposed between all two adjacent active regions.

(16) The surface emitting laser according to any one of (1) to (14), in which the tunnel junction is not disposed at least between the active region closest to an emission surface of the surface emitting laser and the active region adjacent to the active region.

(17) The surface emitting laser according to any one of (1) to (16), in which in each of at least two sets of two adjacent active regions, the tunnel junction is disposed between the two adjacent active regions, and the plurality of tunnel junctions has a higher impurity doping concentration as being farther from an emission surface of the surface emitting laser.

(18) A surface emitting laser array including a plurality of the surface emitting lasers according to any one of (1) to (17).

(19) An electronic device including the surface emitting laser according to any one of (1) to (17).

(20) An electronic device including the surface emitting laser array according to (18).

REFERENCE SIGNS LIST

1, 101, 201, 1-1, 1-2, 1-3 Surface emitting laser
2, 102, 202 Substrate
4, 104, 204 First multilayer film reflector
17, 117, 217 Second multilayer film reflector
6, 106, 206 First active region (active region)
10, 110, 210 Second active region (active region)
14, 114, 214 Third active region (active region)
24 Fourth active region (active region)
8 First tunnel junction (tunnel junction)
12 Second tunnel junction (tunnel junction)
1000 Distance measuring device (electronic device)
ES1, ES2, ES3, ES4 Emission spectrum
λP1, λP2, λP3, λP4 Peak wavelength
ExS Emission surface.

The invention claimed is:

1. A surface emitting laser comprising:

first and second multilayer film reflectors;

a plurality of active regions stacked between the first and second multilayer film reflectors; and a tunnel junction disposed between at least one set of two adjacent active regions, wherein the plurality of active regions includes at least two of the active regions in which peak wavelengths of emission spectra are different from each other, in each of at least two sets of two adjacent active regions, the tunnel junction is disposed between the two adjacent active regions, and the plurality of tunnel junctions has a higher impurity doping concentration as being farther from an emission surface of the surface emitting laser.

2. The surface emitting laser according to claim 1, wherein each of the plurality of active regions includes at least one active layer, and the at least two active regions are different from each other in at least one of a composition of the active layers, a thickness of the active layers, and a number of the active layers.

3. The surface emitting laser according to claim 1, wherein a peak wavelength of the emission spectrum is shorter as the at least two active regions are closer to an emission surface of the surface emitting laser.

4. The surface emitting laser according to claim 2, wherein a composition of an element having a largest lattice constant among elements included in the active layers is smaller as the at least two active regions are closer to an emission surface of the surface emitting laser.

5. The surface emitting laser according to claim 2, wherein a thickness of the active layers is smaller as the at least two active regions are closer to an emission surface of the surface emitting laser.

6. The surface emitting laser according to claim 2, wherein a number of the active layers is larger as the at least two active regions are closer to an emission surface of the surface emitting laser.

7. The surface emitting laser according to claim 1, wherein a difference between peak wavelengths of emission spectra of at least one set of two adjacent active regions is 5 nm or more and 50 nm or less.

8. The surface emitting laser according to claim 1, wherein a difference between peak wavelengths of emission spectra of at least one set of two adjacent active regions is 15 nm or more and 30 nm or less.

9. The surface emitting laser according to claim 1, wherein a difference between peak wavelengths in an active region in which an emission spectrum has a longest peak wavelength and an active region in which an emission spectrum has a shortest peak wavelength among the at least two active regions is 30 nm or more and 60 nm or less.

10. The surface emitting laser according to claim 1, wherein the plurality of active regions is at least three active regions, and the at least two sets of two of the active regions adjacent to each other are different in a difference between peak wavelengths of emission spectra in the two of the active regions adjacent to each other.

11. The surface emitting laser according to claim 1, wherein the plurality of active regions is at least three active regions, and the at least two sets of two of the active regions adjacent to each other are same in a difference between peak wavelengths of emission spectra in the two of the active regions adjacent to each other.

12. The surface emitting laser according to claim 2, wherein the at least one active layer includes $In_xGa_{(1-x)}As$ ($0 \leq x \leq 1.0$).

13. The surface emitting laser according to claim 12, wherein each of the plurality of active regions includes a semiconductor layer including $Al_yGa_{(1-y)}As$ ($0 \leq y \leq 1.0$).

14. The surface emitting laser according to claim 1, wherein the tunnel junction is disposed at least between the active region farthest from an emission surface of the surface emitting laser among the plurality of active regions and the active region adjacent to the active region.

15. The surface emitting laser according to claim 1, wherein the tunnel junction is disposed between all two adjacent active regions.

16. The surface emitting laser according to claim 1, wherein the tunnel junction is not disposed at least between the active region closest to an emission surface of the surface emitting laser and the active region adjacent to the active region.

17. A surface emitting laser array comprising a plurality of the surface emitting lasers according to claim 1.

18. An electronic device comprising the surface emitting laser according to claim 1.

19. An electronic device comprising the surface emitting laser array according to claim 17.

* * * * *